(12) United States Patent
Rogers et al.

(10) Patent No.: US 11,571,766 B2
(45) Date of Patent: Feb. 7, 2023

(54) LASER MARKING OF AN ELECTRONIC DEVICE THROUGH A COVER

(71) Applicant: Apple Inc., Cupertino, CA (US)

(72) Inventors: Matthew S. Rogers, San Jose, CA (US); Manish Mittal, San Jose, CA (US); Marta M. Giachino, Palo Alto, CA (US); Michael S. Nashner, San Jose, CA (US)

(73) Assignee: APPLE INC., Cupertino, CA (US)

( * ) Notice: Subject to any disclaimer, the term of this patent is extended or adjusted under 35 U.S.C. 154(b) by 745 days.

(21) Appl. No.: 16/439,547

(22) Filed: Jun. 12, 2019

(65) Prior Publication Data

US 2020/0180076 A1 Jun. 11, 2020

Related U.S. Application Data

(60) Provisional application No. 62/777,685, filed on Dec. 10, 2018.

(51) Int. Cl.
| | | |
|---|---|---|
| H05K 5/02 | (2006.01) | |
| B44C 1/00 | (2006.01) | |
| B32B 17/10 | (2006.01) | |
| B41M 5/26 | (2006.01) | |
| B23K 26/18 | (2006.01) | |
| B23K 26/354 | (2014.01) | |
| B23K 26/53 | (2014.01) | |
| B23K 103/16 | (2006.01) | |

(52) U.S. Cl.
CPC ............ *B23K 26/18* (2013.01); *B23K 26/354* (2015.10); *B23K 26/53* (2015.10); *B32B 17/10* (2013.01); *B41M 5/26* (2013.01); *B44C 1/005* (2013.01); *H05K 5/0252* (2013.01); *B23K 2103/166* (2018.08); *B32B 2255/28* (2013.01); *B32B 2307/404* (2013.01); *B32B 2451/00* (2013.01); *B32B 2457/20* (2013.01)

(58) Field of Classification Search
None
See application file for complete search history.

(56) References Cited

U.S. PATENT DOCUMENTS

| | | | |
|---|---|---|---|
| 296,631 | A | 4/1884 | Schuetz |
| 1,608,108 | A | 11/1926 | Martus et al. |
| 2,473,848 | A | 8/1947 | Baxter |
| 2,821,589 | A | 1/1958 | Needham |

(Continued)

FOREIGN PATENT DOCUMENTS

| | | |
|---|---|---|
| CH | 689338 | 2/1999 |
| CH | 714005 | 1/2019 |

(Continued)

OTHER PUBLICATIONS

Jaeger, "Color Solid Ink Printing," imaging.org, 4 pages, at least as early as Sep. 23, 2014.

*Primary Examiner* — Laura C Powers
(74) *Attorney, Agent, or Firm* — Brownstein Hyatt Farber Schreck, LLP

(57) ABSTRACT

Markings for electronic devices are disclosed. Markings are formed through a laser-based process which transforms a colorant in a multilayer structure disposed along an interior surface of a cover. The transformed colorant defines a marking visible along an external surface of the electronic device.

20 Claims, 18 Drawing Sheets

(56) References Cited

U.S. PATENT DOCUMENTS

| | | |
|---|---|---|
| 3,123,792 A | 3/1964 | Klemm |
| 3,471,663 A | 10/1969 | Farrell |
| 3,499,281 A | 3/1970 | Denley |
| 3,535,869 A | 10/1970 | Strigini |
| 3,846,697 A | 11/1974 | Giger |
| 3,982,917 A | 9/1976 | Upton |
| 4,227,059 A | 10/1980 | Ogawa |
| 4,340,791 A | 7/1982 | Sorenson |
| 4,598,035 A | 7/1986 | Usami et al. |
| 4,849,618 A | 7/1989 | Namikawa et al. |
| 4,861,620 A | 8/1989 | Azuma et al. |
| 5,180,051 A | 1/1993 | Cook et al. |
| 5,206,496 A | 4/1993 | Clement et al. |
| 5,214,530 A | 5/1993 | Coombs et al. |
| 5,215,864 A | 6/1993 | Laakmann |
| 5,327,201 A | 7/1994 | Coleman et al. |
| 5,496,977 A | 3/1996 | Date et al. |
| 5,523,125 A | 4/1996 | Kennedy et al. |
| 5,607,607 A | 3/1997 | Naiman et al. |
| 5,718,326 A | 2/1998 | Larose et al. |
| 5,761,111 A | 6/1998 | Glezer et al. |
| 5,936,213 A | 8/1999 | Bisquez et al. |
| 6,040,543 A | 3/2000 | Mina et al. |
| 6,084,190 A | 7/2000 | Kenmochi |
| 6,126,309 A | 10/2000 | Bettelini et al. |
| 6,196,738 B1 | 3/2001 | Shimizu et al. |
| 6,201,196 B1 | 3/2001 | Wergen |
| 6,392,683 B1 | 5/2002 | Hayashi |
| 6,565,770 B1 | 5/2003 | Mayer et al. |
| 6,591,457 B1 | 7/2003 | Howie, Jr. |
| 6,630,635 B1 | 10/2003 | Doepner |
| 6,667,450 B2 | 12/2003 | Bulin et al. |
| 6,670,571 B2 | 12/2003 | Dance |
| 6,707,358 B1 | 3/2004 | Massman |
| 6,734,389 B2 | 5/2004 | Troitski |
| 6,744,458 B2 | 6/2004 | Yamada et al. |
| 6,762,381 B2 | 7/2004 | Kunthady et al. |
| 7,060,933 B2 | 6/2006 | Burrowes et al. |
| 7,101,603 B2 | 9/2006 | Okamura et al. |
| 7,165,846 B2 | 1/2007 | Shinya |
| 7,297,221 B2 | 11/2007 | Hikita |
| 7,414,213 B2 | 8/2008 | Hwang et al. |
| 7,531,765 B2 | 5/2009 | Komagata |
| 7,727,618 B2 | 6/2010 | Iwano |
| 8,003,200 B2 | 8/2011 | Nashiki et al. |
| 8,173,253 B2 | 5/2012 | Green et al. |
| 8,198,626 B2 | 6/2012 | Lee et al. |
| 8,222,773 B2 | 7/2012 | De Iuliis et al. |
| 8,232,502 B2 | 7/2012 | Young et al. |
| 8,451,873 B2 | 5/2013 | Zhang |
| 8,529,775 B2 | 9/2013 | Costin et al. |
| 8,640,413 B2 | 2/2014 | Ruggie et al. |
| 8,802,220 B2 | 8/2014 | Cao et al. |
| 8,859,920 B2 | 10/2014 | Manullang et al. |
| 8,859,923 B2 | 10/2014 | Obata et al. |
| 8,867,320 B2 | 10/2014 | Suzuki et al. |
| 8,882,280 B2 | 11/2014 | Fukaya et al. |
| 8,974,924 B2 | 3/2015 | Weber et al. |
| 9,335,868 B2 | 5/2016 | Hotelling et al. |
| 9,346,124 B2 | 5/2016 | Kato et al. |
| 9,600,694 B1 | 3/2017 | Memering et al. |
| 9,629,271 B1 | 4/2017 | Lancaster-Larocque et al. |
| 9,678,258 B2 | 6/2017 | Hankey et al. |
| 9,727,178 B2 | 8/2017 | Matsuyuki et al. |
| 9,790,126 B2 | 10/2017 | Matsuyuki et al. |
| 9,836,684 B2 | 12/2017 | Finn et al. |
| 9,844,898 B2 | 12/2017 | Hill et al. |
| 9,916,048 B2 | 3/2018 | Ishibashi et al. |
| 10,099,506 B2 | 10/2018 | Walker et al. |
| 2005/0287301 A1 | 12/2005 | Ljubomirsky |
| 2006/0024476 A1 | 2/2006 | Leland et al. |
| 2007/0054067 A1 | 3/2007 | Power |
| 2007/0276504 A1 | 11/2007 | Sparer et al. |
| 2008/0042427 A1 | 2/2008 | Muke |
| 2008/0299408 A1 | 12/2008 | Guo et al. |
| 2008/0304525 A1 | 12/2008 | Kupisiewicz et al. |
| 2009/0166343 A1 | 7/2009 | Lappalainen et al. |
| 2009/0237782 A1 | 9/2009 | Takamatsu et al. |
| 2010/0055022 A1 | 3/2010 | Linares et al. |
| 2010/0119808 A1 | 5/2010 | Li et al. |
| 2011/0109590 A1 | 5/2011 | Park et al. |
| 2012/0052275 A1 | 3/2012 | Hashimoto et al. |
| 2012/0328905 A1 | 12/2012 | Guo et al. |
| 2013/0075126 A1 | 3/2013 | Nashner et al. |
| 2013/0112536 A1 | 5/2013 | Shah et al. |
| 2013/0140746 A1 | 6/2013 | Heverly et al. |
| 2014/0363608 A1 | 12/2014 | Lancaster-Larocque et al. |
| 2016/0180212 A1 | 6/2016 | Herslow et al. |
| 2016/0227655 A1* | 8/2016 | Han .................. C23C 14/06 |
| 2017/0001906 A1 | 1/2017 | Karagoz et al. |
| 2017/0008798 A1 | 1/2017 | Mimoun et al. |
| 2017/0132506 A1 | 5/2017 | Blythe |
| 2018/0065392 A1* | 3/2018 | Wu .................... C08K 3/013 |
| 2019/0039352 A1 | 2/2019 | Zhao et al. |
| 2019/0262948 A1 | 8/2019 | Russell-Clarke et al. |
| 2020/0104549 A1 | 4/2020 | Russell-Clarke et al. |
| 2020/0104550 A1 | 4/2020 | Russell-Clarke et al. |
| 2020/0361817 A1 | 11/2020 | Li et al. |

FOREIGN PATENT DOCUMENTS

| | | |
|---|---|---|
| CN | 1213439 | 4/1999 |
| CN | 1755489 | 4/2006 |
| CN | 1929723 | 3/2007 |
| CN | 101075503 | 11/2007 |
| CN | 101479049 | 7/2009 |
| CN | 101665969 | 3/2010 |
| CN | 101665971 | 3/2010 |
| CN | 101729624 | 6/2010 |
| CN | 101777110 | 7/2010 |
| CN | 101927627 | 12/2010 |
| CN | 102102465 | 6/2011 |
| CN | 201904983 | 7/2011 |
| CN | 201945987 | 8/2011 |
| CN | 201956238 | 8/2011 |
| CN | 202120044 | 1/2012 |
| CN | 102725663 | 10/2012 |
| CN | 102752982 | 10/2012 |
| CN | 202632259 | 12/2012 |
| CN | 102869492 | 1/2013 |
| CN | 202649955 | 1/2013 |
| CN | 102958640 | 3/2013 |
| CN | 202854790 | 4/2013 |
| CN | 103112308 | 5/2013 |
| CN | 103415370 | 11/2013 |
| CN | 103422162 | 12/2013 |
| CN | 203366304 | 12/2013 |
| CN | 103902122 | 7/2014 |
| CN | 104166870 | 11/2014 |
| CN | 204242152 | 4/2015 |
| CN | 105324248 | 2/2016 |
| CN | 107784350 | 3/2018 |
| DE | 102010006665 | 8/2011 |
| EP | 348580 | 1/1990 |
| EP | 0424173 | 4/1991 |
| EP | 1805040 | 7/2007 |
| EP | 2721698 | 4/2014 |
| EP | 3330897 | 6/2018 |
| FR | 2975617 | 11/2012 |
| GB | 581824 | 10/1946 |
| GB | 957644 | 5/1964 |
| GB | 2552406 | 1/2018 |
| JP | S58092597 | 6/1983 |
| JP | H0491875 | 3/1992 |
| JP | H04199735 | 7/1992 |
| JP | H0593811 | 4/1993 |
| JP | 05307088 | 11/1993 |
| JP | H06183189 | 7/1994 |
| JP | H07164787 | 6/1995 |
| JP | 2000012584 | 1/2000 |
| JP | 2002137579 | 5/2002 |
| JP | 2008192993 | 8/2008 |
| JP | 2009143092 | 7/2009 |
| JP | 2009274342 | 11/2009 |

(56) References Cited

FOREIGN PATENT DOCUMENTS

| | | |
|---|---:|---:|
| JP | 201263839 | 3/2012 |
| JP | 201410814 | 1/2014 |
| JP | 2016119396 | 6/2016 |
| JP | 201768416 | 4/2017 |
| KR | 20070046983 | 3/2007 |
| KR | 1020090131944 | 4/2010 |
| KR | 20180020704 | 2/2018 |
| TW | 504647 | 1/2002 |
| TW | 200419720 | 10/2004 |
| TW | I309386 | 5/2009 |
| TW | M414616 | 10/2011 |
| TW | 201231792 | 8/2012 |
| WO | WO01/15916 | 3/2001 |
| WO | WO01/34408 | 5/2001 |
| WO | WO2011/076294 | 6/2011 |
| WO | WO2013/135703 | 9/2013 |
| WO | WO2014/080157 | 5/2014 |
| WO | WO2015/128188 | 9/2015 |
| WO | WO2015/139929 | 9/2015 |
| WO | WO2017/112507 | 6/2017 |

\* cited by examiner

LASER MARKING OF AN ELECTRONIC DEVICE THROUGH A COVER

CROSS-REFERENCE TO RELATED APPLICATION(S)

This application is a non-provisional patent application of and claims the benefit of U.S. Provisional Patent Application 62/777,685, filed Dec. 10, 2018 and titled "Laser Marking of an Electronic Device Through a Cover," the disclosure of which is hereby incorporated herein by reference in its entirety.

FIELD

The described embodiments relate generally to laser marking of electronic devices. More particularly, the present embodiments relate to markings formed, at least in part, using a transformable colorant

BACKGROUND

Electronic devices generally include a housing or other exterior component that may be marked or printed. For example, an exterior of a housing may be marked to provide identifying information such as the manufacturer and the model. In addition, an exterior of a housing may be marked to show that it conforms to regulations of a particular country or region.

Some traditional markings for metal housings are engraved into the metal. However, traditional markings may be subject to wear when applied to the exterior of a housing.

SUMMARY

The following disclosure is generally related to marking of electronic devices. In aspects of the disclosure, a multilayer structure inside the electronic device is marked using a laser-based process. The multilayer structure may be disposed along at least a portion of an interior surface of a transparent cover, allowing the marking to be visible along an exterior surface of the electronic device.

In embodiments, the multilayer structure includes a colorant which is transformable from a first form to a second form using a laser-based process. The marking is defined, at least in part, by the colorant in the second form. The first form and the second form have different optical properties giving the marking a distinct visual appearance. In embodiments, the transformable colorant is a color-changing colorant, such as an irreversible thermochromic colorant.

In embodiments, the colorant in the second form also defines a marking region formed within a set of layers of the multilayer structure. By the way of example, the set of layers comprises a set of color layers, with the marking region formed in at least one of the color layers. As another example, the set of layers comprises an optically clear layer and at least one color layer, with the marking region being formed in the optically clear layer or in at least one of the color layers. The marking may be defined, at least in part, by the colorant(s) in the marking region. The multilayer structure may further comprise additional layers as described herein, such as an optically dense layer or a metal layer.

In embodiments, an electronic device comprises an enclosure component, a display positioned at least partially within the enclosure component, a transparent cover attached to the enclosure component and having an interior surface and an exterior surface, the exterior surface defining a portion of an exterior surface of the electronic device, and a multilayer structure disposed along at least a portion of the interior surface. The multilayer structure comprises an optically dense layer and a set of color layers positioned between the optically dense layer and the interior surface. The set of color layers comprises a first colorant, a first form of a second colorant different than the first colorant and having first optical properties, and a second form of the second colorant defining a marking visible along the exterior surface of the electronic device, the second form transformed from the first form using a laser-based process to have second optical properties different than the first optical properties.

In additional embodiments, an electronic device comprises a display and an enclosure at least partially surrounding the display. The enclosure comprises an enclosure component defining at least a portion of a side exterior surface of the electronic device, a transparent cover attached to the enclosure component and defining at least a portion of a rear exterior surface of the electronic device, and a multilayer structure disposed along at least a portion of an interior surface of the transparent cover. The multilayer structure comprises an optically clear layer disposed along the portion of the interior surface, an optically dense layer, a metal layer positioned between the optically clear layer and the optically dense layer, the metal layer configured to at least partially transmit visible light, a first color layer positioned between the metal layer and the optically dense layer, the first color layer comprising a first colorant, and a second color layer positioned between the first color layer and the optically dense layer, the second color layer comprising a second colorant, a first form of a laser-reactive colorant dispersed within at least one of the first or second color layers, and a second form of the laser-reactive colorant dispersed within at least one of the first or second color layers and defining a marking visible along the rear exterior surface.

In additional embodiments, an enclosure for an electronic device comprises an enclosure component at least partially defining an interior volume for receiving electronic components, a transparent cover attached to the enclosure component and having an interior surface and an exterior surface, the exterior surface defining a portion of an exterior surface of the electronic device, and a multilayer structure disposed along at least a portion of the interior surface. The multilayer structure comprises an optically dense layer and a set of layers positioned between the optically dense layer and the interior surface and having a first region comprising a first form of a color-changing colorant and a second region defining a marking visible along the exterior surface and comprising a second form of the color-changing colorant.

BRIEF DESCRIPTION OF THE DRAWINGS

The disclosure will be readily understood by the following detailed description in conjunction with the accompanying drawings, wherein like reference numerals designate like elements.

Figure 1A:
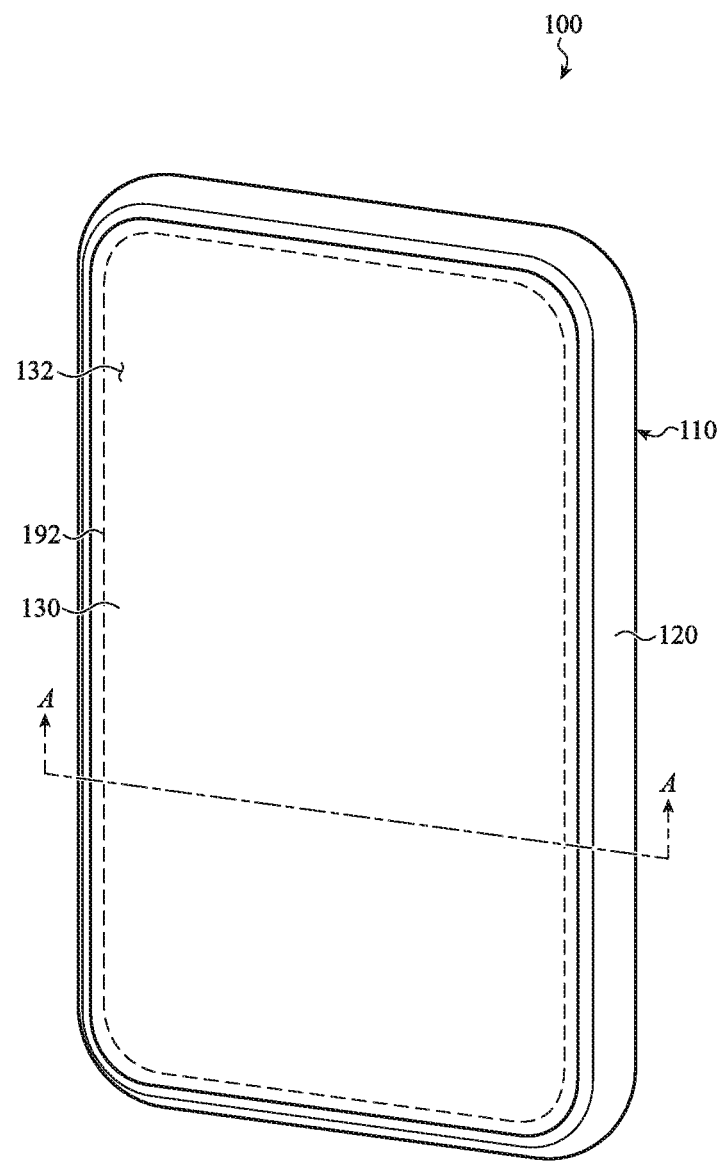
FIG. 1A depicts a front view of a simplified example of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure is generally related to laser marking of electronic devices. In aspects of the disclosure, a marking is defined, at least in part, by a marking region formed in a multilayer structure internal to the electronic device. For example, the multilayer structure may be disposed along an interior surface of a cover. The cover may be a transparent or translucent cover member that is formed from a glass sheet, polymer sheet, multiple sheets, or other similar materials. The marking region is protected by the transparent or translucent member and the marking is visible along the exterior surface of the electronic device.

Embodiments described herein are directed to marking techniques and markings that may have advantages as compared to some traditional techniques and markings. For example, the laser marking methods described herein can produce marking elements and/or marking regions in the multilayer structure without producing visible changes (e.g., artifacts) in the rest of the multilayer structure. Therefore, the laser marking methods described herein may be used to create custom markings on assembled electronic devices, enabling region-specific markings or device-specific markings. In addition, the markings described herein may have enhanced durability because the marking elements or regions defining them are protected by the (transparent) cover.

In aspects of the disclosure, the marking may be in the form of text, a glyph, a symbol, a pattern, an image, or some other type of graphical element. In embodiments, the marking may have a marking feature with a line width or minimum feature width that ranges between 10 microns and 500 microns. In some cases, the marking feature has a line width or minimum feature width that ranges between 25 microns and 100 microns. For example, the minimum feature width may be the smallest width of the marking features. In further embodiments, a dimension of the marking is less than 5 cm, less than 1 cm, less than 5 mm, or less than 1 mm. In additional embodiments, the marking may extend across a layer of the multilayer structure. For example, the marking may produce a color change across an entire region or substantially all of an exterior surface of the electronic device. In one example, the marking extends across substantially all of a rear surface of an electronic device.

The multilayer structure includes a transformable colorant that may be transformed from a first form to a second form by exposure to light from a laser beam. A laser-based process may be used to transform the colorant, thereby producing a marking region in the multilayer structure. As used herein, the transformable colorant may also be referred to as a laser-reactive colorant. When viewed through the cover, the marking region has a visual appearance different from that of the multilayer structure adjacent the marking.

In embodiments, the marking may be defined by a laser-formed marking region that includes one or more regions of colorant that have been transformed by a laser. The laser-formed marking regions may be positioned along one or more layers of a multilayer structure formed along an inner surface of the cover. As discussed in more detail below, the laser-formed marking regions may be defined by multiple marking elements, each of which may correspond to a laser-treated spot created by an exposure to a laser beam or pulse. Adjacent marking elements may overlap or may not overlap. In embodiments, lines and/or shapes of the marking may appear to be continuous rather than formed of discrete marking elements when viewed from a typical viewing distance. In other words, individual marking elements may not be separately visually distinguishable from a particular viewing distance, such as a distance greater than about 5 cm, 10 cm, or 25 cm.

In aspects described herein, at least one layer of the multilayer structure includes a colorant that is transformable from a first form to a second form (the colorant may also be referred to herein as a transformable colorant or a laser-reactive colorant). In some embodiments, the first form and the second form of the colorant have different optical properties (e.g., visual appearances). In embodiments, the colorant transforms from the first form to the second form upon exposure of the multilayer structure to light from a laser. By the way of example, the colorant may be a color-changing or a laser-reactive colorant. As an additional example, the second form of the colorant may be formed as a result of at least a portion of a pigment or dye being vaporized, diffused, and/or ablated from the marking region. To impart permanence to the marking, the transformation of the colorant from the first form to the second form may be irreversible. In some embodiments, the laser-based process transforms the colorant in one or more layers of the multi-layer structure without producing artifacts, (e.g., visible changes) in other layers of the multilayer structure.

In embodiments, the optical properties of the transformed colorant determine, at least in part, the visual appearance of the marking. In additional embodiments, the visual appearance of the marking as observed through the cover is also determined by any additional colorants present in the layer including the transformable colorant, by optical properties of other layers of the multilayer structure, and combinations thereof. Similarly, the visual appearance of the multilayer structure as observed through the cover may be determined by the optical properties of multiple layers of the multilayer structure.

In embodiments, the visual appearance of the marking and/or the multilayer structure may be described by its color(s) and other optical properties as observed through the cover. In addition, elements of the multilayer structure such as color layers, optically dense layers, and colorants may be described in terms of a characteristic color (e.g., the color of the element by itself). The color(s) of the marking, the multilayer structure, and various layers of the multilayer structure may be characterized using a color model. For example, in the hue-saturation-value (HSV) color model, the hue relates to the wavelength(s) of visible light observed when the color feature is viewed (e.g., blue or magenta) and the value relates to the lightness or darkness of a color. The saturation relates to the perceived colorfulness as judged in proportion to its brightness. As another example, coordinates in CIEL*a*b* (CIELAB) color space may be used to characterize the color, wherein L* represents brightness, a* the position between red/magenta and green, and b* the position between yellow and blue. A broadband or semi-broadband illuminant may be used to determine the color of the color feature. For example, a CIE illuminant or other reference illuminant may be used.

Further, color(s) may be characterized in terms of per-ceived wavelengths of visible light (e.g., from about 380 nm to about 750 nm). Chromatic colors have a hue (such as predominantly red, blue, yellow or green). A spectral color is present in the visible spectrum and is associated with a relatively narrow band of wavelengths. Non-spectral colors may include achromatic colors (such as white, gray or black), colors that are mixtures of spectral colors (such as violet-red colors), colors that are mixtures of spectral colors with achromatic colors, and metallic colors. For example, a violet color may be associated with light having a wavelength from about 380 nm to about 450 nm, a blue color may be associated with light having a wavelength between about 450 nm to about 495 nm, a cyan color may be associated with light having a wavelength from about 490 nm to about 520 nm, a green color may be associated with light having a wavelength between 495 nm and 570 nm, a yellow color may be associated with light having a wavelength from about 570 nm to about 590 nm, an orange color may be associated with light having a wavelength from about 590 nm to 620 nm, and a red color may be associated with light having a wavelength from about 620 nm to about 750 nm. In addition, a magenta color may be associated with light having predominantly red wavelengths and blue/violet wavelengths.

In embodiments, the spectral reflectance curve of the marking and/or the multilayer structure may be used to describe its optical properties. The spectral reflectance curve may be obtained over the visible spectrum or over a broader range, such as from about 400 nm to about 1500 nm. In addition, the extent of specular reflection or directionality of the reflectance may be measured. A metallic color may have a spectral reflectance curve similar to that of a metal, with a relatively high reflectance (e.g., at least 80%) over a relatively large portion of the visible spectrum. A metallic color may be produced, in part, by including a thin layer of a metal in front of the layer including a colorant.

These and other embodiments are discussed below with reference to FIGS. 1A-16. However, those skilled in the art will readily appreciate that the detailed description given herein with respect to these figures is for explanatory purposes only and should not be construed as limiting.

FIG. 1A depicts a front view of a simplified example of an electronic device. As shown in FIG. 1A, the electronic device 100 includes a housing 110, which includes an enclosure component 120 and a cover 130. The cover 130 has an exterior surface 132. In embodiments, exterior surface 132 defines at least a portion of the front exterior surface of the electronic device 100.

In this example, the front cover 130 is positioned over a display 192 (edges of display shown with broken lines) that is positioned at least partially within the enclosure component 120 of the housing 110. Display 192 comprises a display element. The cover 130 may define a window or other transparent region for viewing the display. The cover 130 may also be integrated with or coupled to a touch sensor configured to detect or estimate a location of a touch along exterior surface 132. In further embodiments, the display 192 is integrated with or coupled to a touch sensor.

Figure 1B:
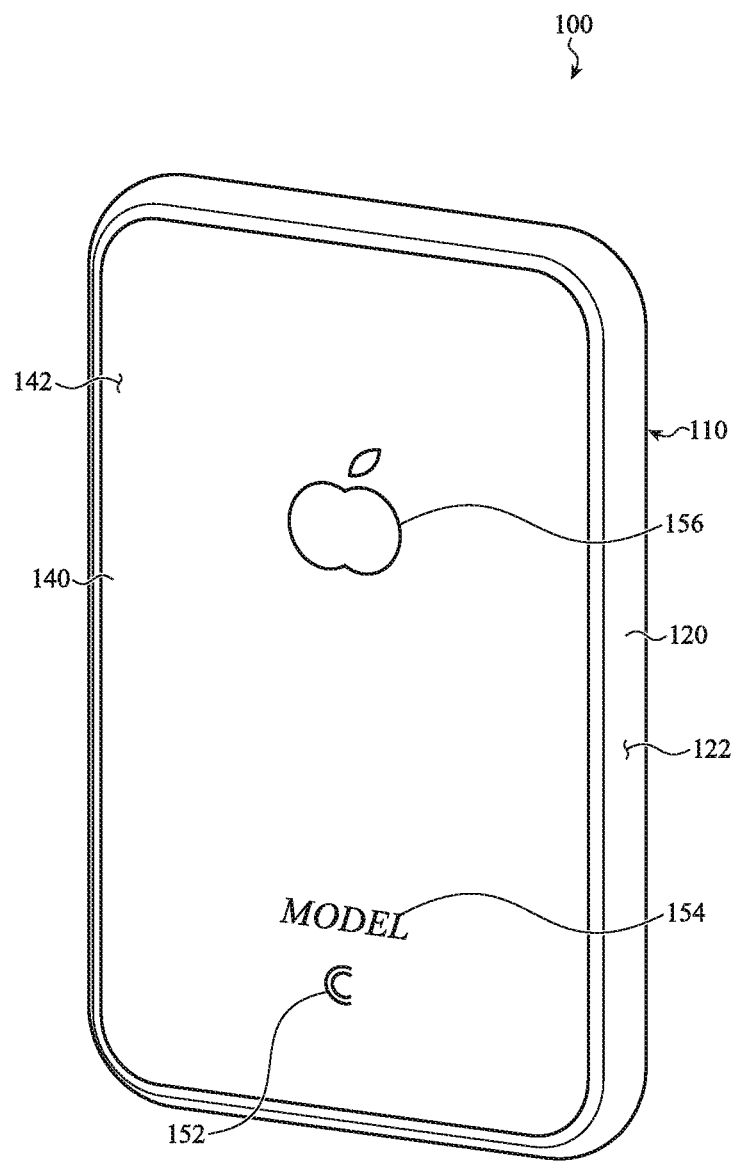
FIG. 1B depicts a rear view of the electronic device of FIG. 1A.

FIG. 1B depicts a rear view of the electronic device 100. In this example, the housing 110 further includes a cover 140. The cover 140 has an exterior surface 142. In embodiments, the exterior surface 142 defines at least a portion of the rear exterior surface of the electronic device. The cover 140 may define a window or other transparent region for viewing markings 152, 154, and 156, which are interior to the cover 140. The enclosure component 120 may define a side exterior surface 122; the side exterior surface 122 may define at least a portion of a side exterior surface of the electronic device 100.

The electronic device 100 comprises markings 152, 154, and 156, which are inward from the cover 140. At least one of markings 152, 154, and 156 may be formed by a metal layer disposed on an interior surface of the cover 140. For example, the metal of the layer may be selected from aluminum, copper, nickel, silver, gold, platinum, and alloys thereof.

The housing 110 may be formed from one or more different materials. In some embodiments, the housing 110 includes one or more glass components, metal or metallic components, ceramic components, glass ceramic components, composite components, or a combination thereof. For example, the enclosure component 120 may comprise a metal or a metallic material.

In embodiments, the covers 130 and 140 may comprise a glass, a glass ceramic, sapphire, a polymer, or a combination thereof. For example, each of the covers 130 and 140 may comprise a sheet of glass. The cover or one or more sheets of the cover may be generally flat or may be formed to a curved shape. In embodiments, the covers 130 and 140 may be transparent to visible light or may define a transparent window. By the way of example, at least one of covers 130 and 140 may comprise a transparent glass sheet. Further, the cover 130 and/or the cover 140 may include a surface coating, such as a hydrophobic or oleophobic coating, along a surface of the glass, glass ceramic, polymer, or sapphire. The thickness of the cover 130 and/or the cover 140 may be less than 3 mm, less than 1 mm, from 50 microns to 1 mm, or from 100 microns to 500 microns.

In additional embodiments, covers as described herein may be included in an all glass or a multi-faceted glass enclosure. In such embodiments, a cover may define one or more surfaces of the enclosure, such as a front surface and a side surface, or a front surface, a side surface and a rear surface.

In embodiments, the cover comprises a glass component such as a glass sheet and at least one surface of the glass component is chemically strengthened through an ion exchange process. For example, a glass surface may be chemically strengthened by exchanging alkali metal ions in the glass with larger alkali metal ions at a temperature above the strain point of the glass. The ion exchange process may introduce a compressive stress region along one or more surfaces of the glass component.

Figure 1C:
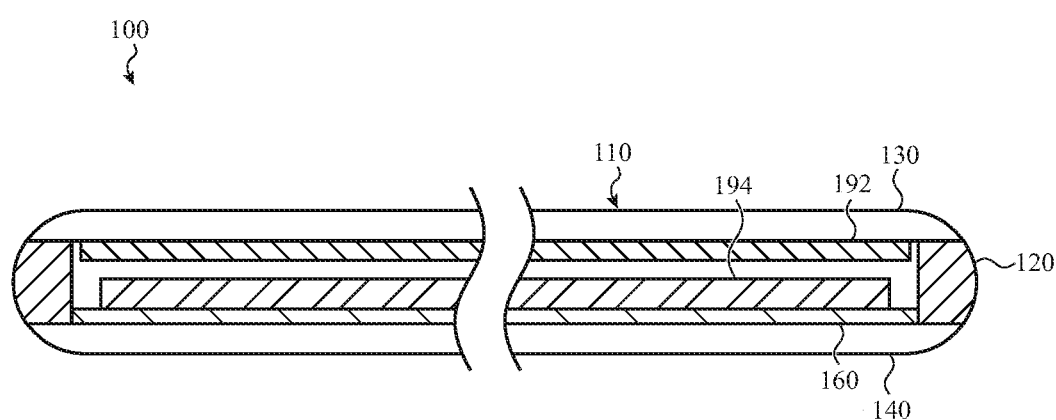
FIG. 1C depicts a cross-sectional view of the electronic device of FIGS. 1A and 1B.

FIG. 1C depicts a partial cross-sectional view of the electronic device 100 of FIGS. 1A and 1B (along line A-A). The enclosure component 120 of housing 110 at least partially defines an interior volume for receiving electronic components. As depicted in FIG. 1C, the electronic device 100 includes a display 192 that is at least partially positioned within the interior volume of the housing 120. In this example, the display 192 is coupled to the cover 130. The display 192 may include a liquid-crystal display (LCD), light-emitting diode, organic light-emitting diode (OLED) display, an active layer organic light emitting diode (AMOLED) display, organic electroluminescent (EL) display, electrophoretic ink display, or the like (as discussed further with respect to FIG. 16). In some embodiments, the electronic device 100 may further include a touch sensor, which may be positioned between the cover 130 and the display 192. Touch sensors are discussed in further detail below with respect to FIG. 16 and that discussion is generally applicable herein.

The multilayer structure 160 is coupled to the cover 140. FIGS. 4-10 and 12-15 show examples of cross-sectional views of multilayer structures and the description provided with respect to the multilayer structures of FIGS. 4-10 and 12-15 is generally applicable herein.

As schematically depicted in FIG. 1C, an electronic component 194 is positioned at least partially within the interior volume. In this example, the electronic component 194 is coupled to the multilayer structure 160. In further embodiments, additional electronic components may be positioned within the housing 110. For example, the electronic device 100 may include one or more of a display, an input device, a sensor, memory, a processor, control circuitry, and a battery. Examples of electronic device components are described further with respect to FIG. 16.

The covers 130 and 140 may be attached to the enclosure component 120. By the way of example, the covers 130 and 140 may be attached to the enclosure component 120 with an adhesive, a fastener, or a combination thereof. Fasteners include, but are not limited to clips or similar mechanical fastening elements.

In embodiments, the electronic device 100 may be a mobile telephone, a notebook computing device (e.g., a notebook), a tablet computing device (e.g., a tablet), a portable media player, a wearable device, or another type of portable device. The electronic device may also be a desktop computer system, a computer component, an input device, or virtually any other type of electronic product or device component.

Figure 2:
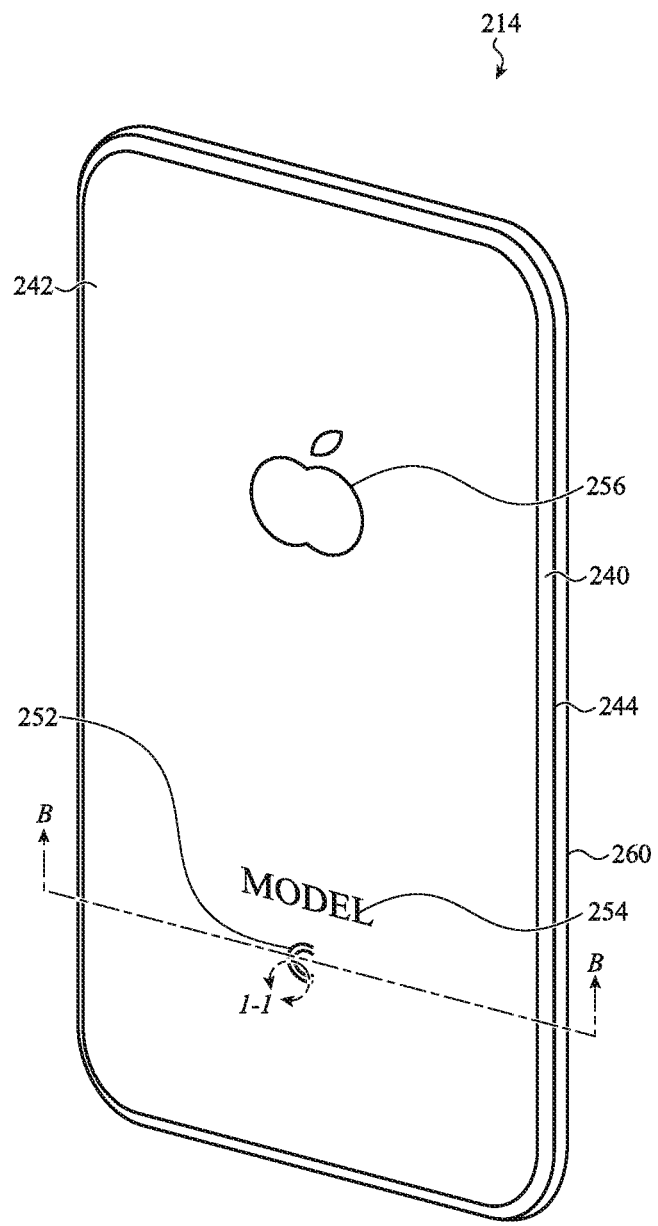
FIG. 2 depicts a cover and a multilayer structure of an electronic device.

FIG. 2 depicts a cover 240 and a multilayer structure 260 of a cover assembly 214 of an electronic device. For example, the cover assembly 214 may be included in an electronic device similar to electronic device 100 of FIGS. 1A-1C. The multilayer structure 260 is disposed along an interior surface 244 of the cover 240. The multilayer structure 260 may be in contact with the interior surface 244. Markings 252, 254, and 256 are visible along the rear exterior surface 242 of the cover 240.

When the cover assembly 214 is included in an electronic device, the markings 252, 254, and 256 may be visible along the rear exterior surface of the electronic device. More generally, markings similar to the markings 252, 254, and 256 may be located on the front, rear, and/or side exterior surfaces of the electronic device. The cover 240 and the multilayer structure 260 may be an example of the cover 140 and the multilayer structure 160 of FIG. 1C.

In the example of FIG. 2, the marking 252 is defined by a transformed colorant within the multilayer structure 260, as is described further with respect to FIGS. 3-15. The markings 254 and 256 are formed by a metal layer disposed on the interior surface 244 of the cover 240. In some embodiments, the metal layer forming the markings 254 and/or 256 is not included in the multilayer structure 260 and a portion of the multilayer structure 260 is disposed along the metallic marking. Each of the markings 254 and 256 may have a thickness configured to substantially prevent transmission of visible light through the marking. In additional embodiments, the metal layer forming the markings 254 and/or 256 is included in the multilayer structure 260 and the markings 254 and/or 256 are at least partially light transmissive. In some cases, the markings 254 and 256 are configured to produce a specular reflection and may have a mirror finish. The metal of the layer may be selected from aluminum, copper, nickel, silver, gold, platinum, and alloys thereof.

Figure 3:
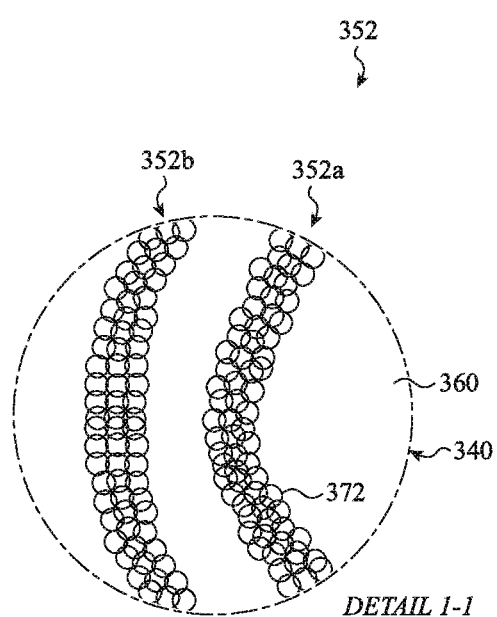
FIG. 3 schematically depicts an enlarged top view of a marking for an electronic device.

FIG. 3 depicts an enlarged view of a portion of a marking 352. The marking 352 may be an example of the marking 252 of FIG. 2 (Detail 1-1). The portion of the marking 352 illustrated in FIG. 3 defines two curves 352a and 352b. The curves 352a and 352b are visible through the cover 340. Each of the curves 352a and 352b is defined by multiple marking elements 372 formed in the multilayer structure 360. As previously described, lines and/or shapes in the marking 352 may appear to be continuous rather than formed of discrete marking elements 372 when viewed from a typical viewing distance. However, for the purposes of illustration, FIG. 3 depicts discrete marking elements 372 which overlap one another. In additional embodiments, the marking elements 372 may abut one another or may be spaced apart from one another, as illustrated schematically in FIG. 11.

In embodiments, the marking elements 372 are formed by transforming a colorant in at least one layer of the multilayer structure 360 (e.g., a color layer). For example, the marking element 372 may be defined by a spot of colorant that has been exposed to a pulse from a laser, which transforms at least some of the colorant from a first form to a second form in a localized region of the layer. In additional embodiments, transformation of the colorant in the localized region produces a difference in optical properties between the localized region and an adjacent region of the layer. The marking elements 372 may cooperate to form a marking region in the layer of the multilayer structure. Examples of such marking regions are illustrated in the cross-sectional views of FIGS. 4-10.

Figure 4:
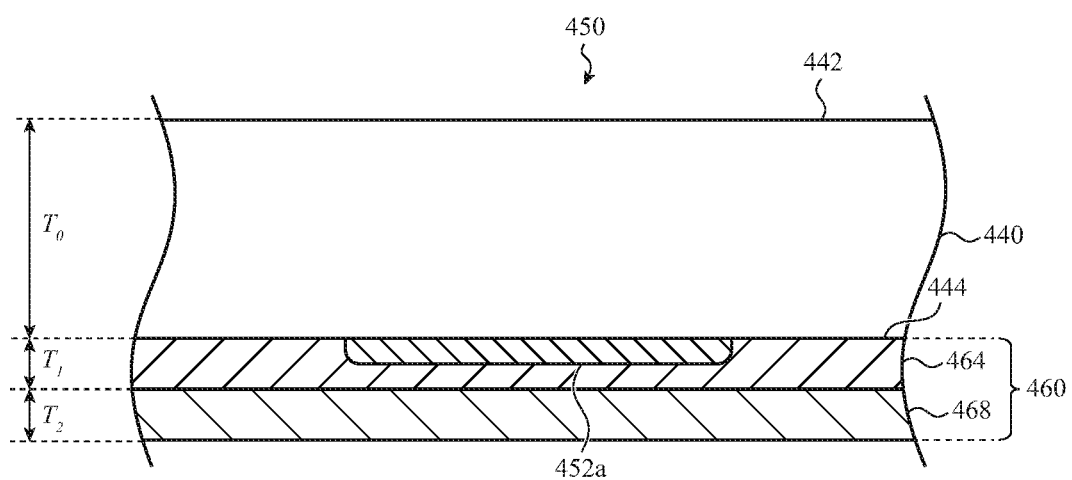
FIG. 4 depicts a cross-sectional view of a marking region formed in a color layer of a multilayer structure.

FIG. 4 depicts a cross-sectional view of a marking region 452a formed in a color layer 464 of a multilayer structure 460. The marking region 452a may at least partially define a marking 450 (typically viewed through a cover 440). The marking 450 may be an example of a portion of the marking 252 of FIG. 2 (with the cross-section taken along line B-B in FIG. 2) or of all or part of any other markings described herein.

As shown in FIG. 4, the multilayer structure 460 further comprises an optically dense layer 468. As previously described, the multilayer structure 460 is disposed along an interior surface 444 of the cover 440. As depicted in FIG. 4, the color layer 464 is disposed along the cover 440 and the optically dense layer 468 is disposed along the color layer 464. The exterior surface 442 of the cover 440 is generally opposite the interior surface 444 as depicted in FIG. 4. The thickness of the cover 440 is indicated by $T_0$, the thickness of the color layer 464 is indicated by $T_1$ and the thickness of the optically dense layer 468 is indicated by $T_2$. The multilayer structure 460 depicted in FIG. 4 is a simplified representation and may include additional layers or components, depending on the implementation.

In embodiments, the marking region 452a defines at least the shape and the position of the marking 450 visible along the exterior surface of the electronic device. As shown in FIG. 4, the marking region 452 is formed in the color layer 464. The marking region 452a corresponds to an at least partially transformed region of the color layer 464 and therefore includes a second form of the transformable colorant. A region of the color layer 464 adjacent the marking region 452a is not transformed, providing a difference in optical properties between the marking region 452a and the adjacent region of the color layer 464. Thus, the marking region 452a may be visually distinct from the adjacent region. In embodiments, this difference in optical properties contributes to a difference in color between the marking 450 and the adjacent multilayer structure 460 as observed through the cover. The color of the marking visible along the exterior surface of the electronic device typically also depends on other components of the multilayer structure 460, as explained below.

Figure 6:
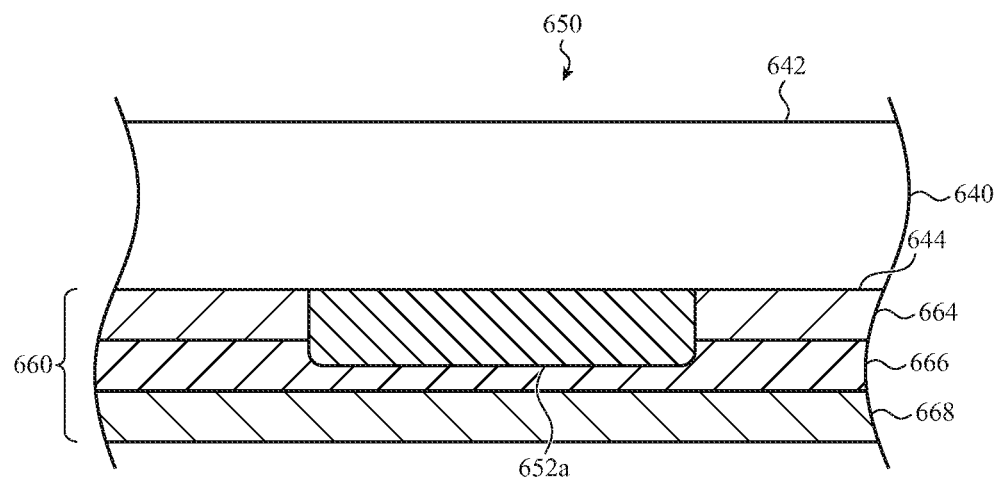
FIG. 6 depicts a cross-sectional view of a marking region formed in multiple color layers of a multilayer structure.

Generally, the marking region 452a comprises multiple marking elements, as is depicted in FIG. 3. For simplicity, the details of the marking elements which make up marking region 452a are not shown in FIG. 4. Although the marking region 452a is hatched uniformly for convenience, it is not required that the transformation of the colorant in the marking region be uniform. In particular, variations in intensity across the laser beam and variations in the amount of overlap between marking elements may produce variations in the amount of transformation of the colorant in the marking region. Further, it is not required that all the colorant in the marking region be transformed to the second form in order to produce a marking. In embodiments, only enough colorant in the marking region is transformed to produce a marking 450 visibly different from that of the adjacent multilayer structure. In additional embodiments (e.g., as shown in FIG. 6), the marking region extends across the entirety of one or more color layers.

The description of the marking region 452a, the color layer 464, the optically dense layer 468, and optional additional layers may be generally applicable to multilayer structures as described herein. In addition, the description herein with respect to FIG. 4 may apply more generally to the multilayer structures described herein and marking regions formed in such multilayer structures.

The color layer 464 comprises a colorant that is transformable from a first form to a second form upon exposure of the multilayer structure to light from a laser. This colorant may also be referred to herein as a transformable colorant or a laser-reactive colorant. Typically, at least one of the first form and the second form of the transformable colorant has a characteristic chromatic or achromatic color. Since the size of the colorants in the marking region 452a and the untransformed region of the color layer 464 is typically small, differences in colorants between the marking region 452a and the untransformed region is schematically indicated by hatching differences.

Generally the laser produces a beam, such as a pulsed beam, which is directed towards the multilayer structure 460 through the cover 440. In embodiments, the laser is focused through the cover 440 onto the layer(s) comprising the colorant to be transformed. Exposing the colorant to the focused laser beam transforms the colorant from a first form to a second form. In embodiments, the transformation of the colorant does not produce artifacts (e.g., visible changes) in the rest of the multilayer structure.

In embodiments, the first form and the second form of the transformable colorant differ in optical properties, particularly over the visible range. For example, the first form may have a first absorption spectrum and the second form may have a second absorption spectrum different from the first absorption spectrum. As an additional example, the second form may have a first reflectance spectrum and the second form may have a second reflectance spectrum different from the first reflectance spectrum.

In additional embodiments, the color layer 464 includes multiple colorants mixed together. For example, the color layer 464 may comprise a first colorant and a second colorant, with the second colorant being a transformable colorant. In embodiments, the optical properties of the transformable colorant and the other colorant(s) in the color layer 464 together affect the optical properties of the color layer and the marking. When the marking region 452a includes both the transformable colorant in the second form and an additional colorant, color mixing (e.g., subtractive color mixing) may affect the color of the marking. In addition, if the marking region 452a also includes the first form of the transformable colorant and/or the marking region 452a does not extend through a thickness of the color layer 464, color mixing due to the presence of the first form of the transformable colorant, the second form of the transformable colorant, and any additional colorants may also occur.

The transformable colorant may comprise an organic material, an inorganic material, an organometallic material, or a hybrid material. In embodiments, the transformable colorant comprises a dye or a pigment. In additional embodiments, the transformable colorant may comprise a dye or pigment in combination with at least one other component such as a developer and a solvent.

In embodiments, the transformable colorant comprises a color-changing material. The transformation of a color-changing material from the first form to the second form may contribute to the color of the marking and to a color difference between the marking 450 and the adjacent multilayer structure 460 as observed through the cover 440. By the way of example, the first form of the color-changing material may have a first characteristic hue and the second form may have a second characteristic hue different than the first characteristic hue. As additional examples, the first form may appear colorless and the second form may have a characteristic chromatic or achromatic color (a positive transformation) or the first form may have a characteristic chromatic or achromatic color and the second form may appear colorless (a negative transformation). Further, the first form may have a first achromatic color (e.g., black) and the second form may have a second achromatic color. (e.g., white).

In aspects of the disclosure, the optical properties of color-changing material may change in response to stimuli including, but not limited to, light exposure, a temperature change (e.g., heating), exposure to a chemical agent, and combinations thereof. In embodiments, the color-changing material is an irreversible photochromic material or an irreversible thermochromic material. Irreversible thermochromic materials include, but are not limited to, leuco dye pigments, conjugated polymers, and complexes or compounds including a metal or a metal oxide. The optical properties of the color-changing material may change due to factors including, but not limited to, a change of phase (e.g., evaporation or phase change of an assembly of molecules), phase separation, a change in composition (e.g., due to a chemical reaction such as decomposition or oxidation), complex formation, a change in ligand geometry or coordination; and a change in structure such as molecular structure, crystalline structure, or electronic structure (including spin state).

In embodiments, the transformable colorant is sensitive to the wavelength(s) of light produced by the laser. In additional embodiments, the color layer further comprises another component (e.g., a photo sensitizer or an absorber) which is sensitive to the wavelength(s) of light produced by the laser and activates the transformable colorant. When one or more additional colorants are present in the layer, these additional colorants may or may not be sensitive to the wavelength(s) of light produced by the laser or the optional photosensitizer or absorber.

The one or more additional colorants may comprise a dye, a pigment, or a combination thereof. Further, the one or more additional colorants may comprise an organic material, an inorganic material, an organometallic material, or a hybrid material. Example of inorganic pigments include, but are not limited to carbon-based pigments (e.g., carbon black) and metal based pigments such as oxides (e.g., titanium dioxide, chromium oxide, iron oxides), sulfides, phosphates, and silicates (e.g., ultramarine). Examples of organic pigments include, but are not limited to azo pigments and phtalocyanine pigments. Examples of organic dyes include, but are not limited to, azo dyes, anthraquinone dyes, and phtalocyanine dyes.

As shown in FIG. 4, the color layer 464 may extend across a lateral dimension of the multilayer structure 460. In additional embodiments, the color layer 464 is more localized and forms a localized layer over the interior surface 444 of the cover 440 (as described further with respect to FIG. 5).

Generally, the color layer 464 further comprises a polymer, with the transformable colorant and any additional colorants being dispersed in the polymer. The polymer may act as a binder for the colorants. For example, the polymer may be polyester-based, epoxy-based, or urethane-based, or another suitable polymer. In embodiments, the polymer does not significantly absorb the wavelength(s) of light produced by the laser. The color layer 464 includes an effective amount of the colorant. In embodiments, the weight percentage of the colorant is from about 5 wt % to about 40 wt %. In embodiments, the color layer 464 is a polymeric layer, with the polymeric layer including the polymer, the colorant(s), and optional additives. Optional additives include, but are not limited to, one or more extenders, diluents, polymerization initiators, and/or stabilizers. The thickness of color layer 464 may be from about 2 microns to about 10 microns. Alternately, a color layer 464 may be referred to herein as an ink layer.

The color layer 464 may be transparent, translucent, or opaque. A translucent color layer 464 may include a colorant that scatters visible light, but does not completely prevent transmission of visible light through the color layer. A transparent color layer 464 may include a colorant which primarily absorbs, rather than scatters, light.

The layer 468 is an optically dense layer. For example, the optical density of the optically dense layer 468 may be described by $OD=\log_{10}$ (initial intensity/transmitted intensity) may be greater than or equal to 1, greater than or equal to 2, or greater than or equal to 3. Generally, the optically dense layer 468 comprises a polymer. For example, the polymer may be polyester-based, epoxy-based, or urethane-based, or another suitable polymer. In embodiments, the optically dense layer 468 is a polymeric layer. The optically dense layer 468 may further comprise one or more pigments, dyes, or a combination thereof. As an example, the optically dense layer 468 has substantially wavelength independent (neutral) reflectance and/or absorption spectrum over the visible range. In addition, the optically dense layer 468 may have an achromatic characteristic color. The thickness of the optically dense layer 468 may be from about 2 microns to about 10 microns.

In embodiments, the optical properties of the optically dense layer 468 also contribute to the color of the marking 450 and the adjacent multilayer structure 460 as observed through the cover 440. In further embodiments, the optical properties of the optically dense layer 468 may be configured to adjust the lightness and/or the chroma of the marking. In addition, the optically dense layer 468 may be configured so that it does not substantially affect the hue of the marking. As referred to herein, the chroma relates to the perceived colorfulness of an area and may be judged as a proportion of the brightness of a similarly illuminated area that appears white or highly transmitting. For example, an optically dense layer 468 having a characteristic white or light gray color may produce a lighter marking than an optically dense layer having a characteristic dark gray or black color.

In embodiments, the optically dense layer 468 is substantially free of artifacts from the laser-based process. For example, the optical properties of the optically dense layer 468 may be substantially the same in a region corresponding to the marking region and in an adjacent region.

In additional embodiments, the multilayer structure 460 may comprise additional layers. If the additional layers are located in front of the optically dense layer 468 (i.e., towards the cover), the optical properties of these additional layers may also affect the color of the marking 450 and the multilayer structure 460 as observed through the cover 440. For example, the multilayer structure 460 may comprise multiple color layers, with at least one of the color layers comprising a transformable colorant. Other layers of the multilayer structure 460 may comprise colorants which are not sensitive to the wavelength(s) of light produced by the laser. Examples of multilayer structures including multiple color layers are shown in FIGS. 5-10 and 12-15.

The multilayer structure 460 may further comprise a metal layer. In embodiments, the metal layer may have a thickness configured to allow transmission of visible light. For example, the metal layer may transmit at least 40% of light in the visible spectrum. In embodiments, the metal layer may have a thickness greater than about 0.5 nm and less than 10 nm, less than 5 nm, less than 3 nm, less than 2 nm, or less than 1 nm. Thin metal layers may be formed by a deposition process such as a physical vapor deposition process. The metal of the metal layer may be selected from aluminum, copper, nickel, silver, gold, platinum, and alloys thereof. Such a metal layer may give a metallic or mirror effect to the marking and multilayer structure as seen through the cover. Typically the metal layer is in front of the color layer(s), but in additional embodiments the metal layer may be positioned behind the color layer(s). Examples of multilayer structures including a metal layer are depicted in FIGS. 8-9 and 14-15.

Further, an optically clear layer may be included in the multilayer structure 460 in front of the color layer(s) or in front of a metal layer and the color layer(s) as depicted in FIGS. 7-10 and 14-15. In some embodiments, an optically clear layer may include a stabilizer to limit UV degradation of color layers behind the optically clear layer. In embodiments, the optically clear layer is a polymeric layer. In embodiments, the thickness of the optically clear layer is from about 1 micron to about 5 microns. The optically clear layer may be transparent to visible light and may appear essentially colorless.

Figure 10:
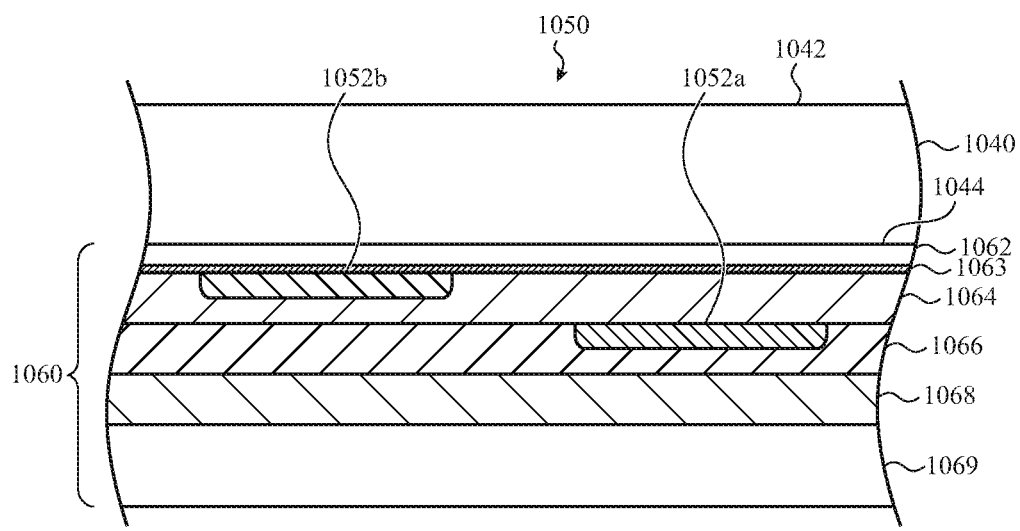
FIG. 10 depicts a cross-sectional view of marking regions formed in two color layers of a multilayer structure and behind a metal layer.

In addition, the multilayer structure 460 may comprise additional polymeric layers behind and disposed along the optically dense layer 468 (as depicted in FIG. 10). If components of the electronic device are glued to the multilayer structure, these additional layers may include a protective layer which protects the color layers of the multilayer structure from damage due to the glue. The additional layers may further include a layer inwards of the protective layer which facilitates adhesion of the multilayer structure to the glue. These additional polymeric layers may be polyester-based, epoxy-based, urethane-based, acrylic-based, or may comprise any other suitable polymer. The thickness of these additional layers may be from about 2 microns to about 20 microns or from about 5 microns to about 15 microns.

The total thickness of the multilayer structure 460 may be from about 30 microns to about 70 microns. In embodiments, the layers of the multilayer structure adhere or bond to each other due to intermolecular forces. In additional embodiments, the multilayer structure 460 adheres or bonds to the cover.

Figure 5:
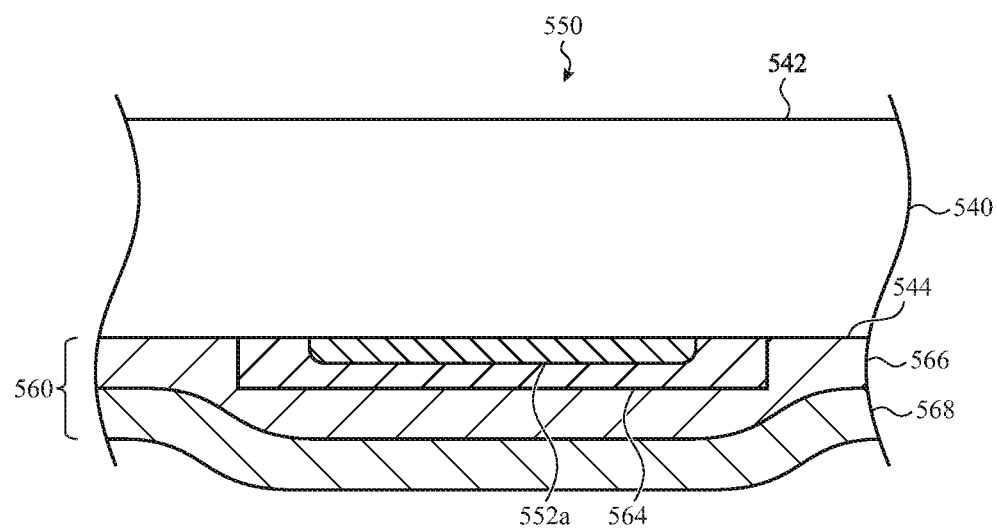
FIG. 5 depicts a cross-sectional view of a marking region formed in a localized color layer of a multilayer structure.

FIG. 5 depicts a cross-sectional view of marking region 552a formed within a set of color layers 564 and 566. The marking region 552a may at least partially define a marking 550 (typically viewed through a cover 540). The marking 550 may be an example of a portion of the marking 252 of FIG. 2 (with the cross-section taken along line B-B in FIG. 2) or of all or part of any other markings described herein.

As depicted in FIG. 5, the marking region 552a is formed in the color layer 564. The color layer 564 has a lateral dimension less than that of the color layer 566 and therefore may be referred to as a localized layer. The color layer 566 conforms to the shape of the color layer 564. The multilayer structure 560 further comprises an optically dense layer 568 in addition to the set of color layers 564 and 566. The details of the marking elements comprising the marking region 552a are not shown in FIG. 5.

The color layer 564 comprises a transformable colorant as previously described. The marking region 552a corresponds to an at least partially transformed region of the color layer 564 and defines the marking 550 visible along the exterior surface of the electronic device. A region of the color layer 564 adjacent the marking region 552a is not transformed, providing a difference in optical properties between the marking region 552a and the adjacent region of the color layer 564. Further, a similar difference in optical properties may be present between the marking region 552a and a nearby region of the color layer 566. In embodiments, the difference(s) in optical properties contributes to a difference in color between the marking 550 and the adjacent multilayer structure 560 observed through the cover 540. As previously described with respect to FIG. 4, the color layer 564 may include one or more colorants in addition to the transformable colorants(s).

The color layer 566 also includes one or more colorants. In embodiments, the colorant(s) in the color layer 566 produce a similar visual effect to the colorant(s) in the color layer 564 prior to laser marking. In other words, the color layer 564 may be color matched to the color layer 566 (and vice versa). In some embodiments, the colorant in the color layer 566 is not sensitive to the wavelength(s) of light produced by the laser. By the way of example, the color layer 564 may include a first colorant and a second colorant which is a transformable colorant and the color layer 566 may also include the first colorant.

As previously described, the multilayer structure 560 is disposed along the interior surface 544 of the cover 540. As depicted in FIG. 5, the color layer 564 and a portion of the color layer 566 are disposed along the cover 540, another portion of the color layer 566 is disposed along the color layer 564, and the optically dense layer 568 is disposed along the color layer 566. The exterior surface 542 of the cover 540 is generally opposite the interior surface 544 as depicted in FIG. 5.

In aspects described herein, the optical properties of the marking region 552a, the color layer 566, and the optically dense layer 568 contribute to the visual appearance of the marking 550 as observed through the cover 540. If the marking region 552a does not extend through the thickness of the color layer 564, the optical properties of the color layer 564 may also contribute to the visual appearance of the marking 550. In additional aspects described herein, the optical properties of the color layers 564 and 566 and the optically dense layer 568 contribute to the visual appearance of the multilayer structure 560 adjacent the marking 550 as observed through the cover 540.

FIG. 6 depicts a cross-sectional view of a marking region 652a formed in a set of color layers, 664 and 666. The marking region 652a may at least partially define a marking 650 (typically viewed through a cover 640). The marking 650 may be an example of a portion of the marking 252 of FIG. 2 (with the cross-section taken along line B-B in FIG. 2) or of all or part of any other markings described herein.

As depicted in FIG. 6, each of the color layers 664 and 666 comprise a transformable colorant and the marking region 652a is formed in the color layer 664 and a portion of the color layer 666. The multilayer structure 660 further comprises an optically dense layer 668 in addition to the set of color layers 664 and 666.

As previously described, the multilayer structure 660 is disposed along the interior surface 644 of the cover 640. As depicted in FIG. 6, the color layer 664 is disposed along the cover 640, the color layer 666 is disposed along the color layer 664, and the optically dense layer 668 is disposed along the color layer 664. The exterior surface 642 of the cover 640 is generally opposite the interior surface 644 as depicted in FIG. 6.

Each of the color layers 664 and 666 comprise a transformable colorant as previously described. The marking region 652a corresponds to an at least partially transformed region of the color layers 664 and 666 and defines the marking 650 visible along the exterior surface of the electronic device. The regions of the color layers 664 and 666 adjacent the marking region 652a are not transformed, providing a difference in optical properties between the marking region 652a and the adjacent regions of the color layers 664 and 666. In embodiments, these differences in optical properties contribute to a difference in color between the marking 650 and the adjacent multilayer structure 660 as observed through the cover 640. In additional aspects of the disclosure, each of the color layers 664 and 666 may include one or more colorants in addition to the transformable colorants(s).

By the way of example, the color layer 664 may include a first colorant and a second colorant which is a transformable colorant. The color layer 666 may include a third colorant and a fourth colorant which is a transformable colorant. The first and the third colorant may be the same or may be different. The second colorant and the fourth colorant may be the same or may be different.

In aspects described herein, the optical properties of the marking region 652a and the optically dense layer 668 contribute to the visual appearance of the marking region 652a as observed through the cover. The optical properties of the color layer 666 may also contribute to the visual appearance of the marking 650. In additional aspects described herein, the optical properties of the color layers 664 and 666 and the optically dense layer 668 contribute to the visual appearance of the multilayer structure 660 adjacent the marking 650 as observed through the cover 640.

Figure 7:
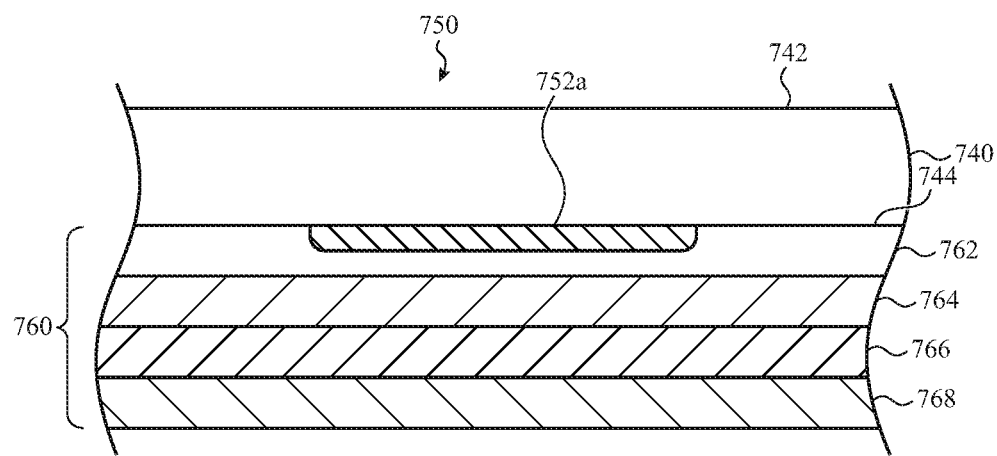
FIG. 7 depicts a cross-sectional view of a marking region formed in an optically clear layer of a multilayer structure.

FIG. 7 depicts a cross-sectional view of marking region 752a within a set of layers comprising an optically clear layer 762 and two color layers, 764 and 766. The marking region 752a may at least partially define a marking 750 (typically viewed through a cover 740). The marking 750 may be an example of a portion of the marking 252 of FIG. 2 (with the cross-section taken along line B-B in FIG. 2) or of all or part of any other markings described herein.

As depicted in FIG. 7, the optically clear layer 762 comprises a transformable colorant and the marking region 752a is formed in the optically clear layer 762. The multilayer structure 760 further comprises an optically dense layer 768 in addition to the optically clear layer 762 and the color layers 764 and 766.

As previously described, the multilayer structure 760 is disposed along the interior surface 744 of the cover 740. As depicted in FIG. 7, the optically clear layer 762 is disposed along the cover 740, the color layer 764 is disposed along the optically clear layer 762, the color layer 766 is disposed along the color layer 764, and the optically dense layer 768 is disposed along the color layer 766. The exterior surface 742 of the cover 740 is generally opposite the interior surface 744 as depicted in FIG. 7.

The optically clear layer 762 comprises a transformable colorant. In the embodiment shown in FIG. 7, the first form of the transformable colorant appears colorless. For example, the optically clear layer 762 prior to laser marking has a relatively high transmittance (e.g., at least 80%, or at least 85%) and does not appear to selectively absorb some wavelengths of visible light. If an optional additive is included in this layer, it also appears colorless. The second form of the transformable colorant does not appear to be colorless. For example, the second form of the transformable colorant may selectively absorb some wavelengths of visible light. Therefore, the marking region 752a has reduced optical clarity as compared to an adjacent region of the optically clear layer 762.

The marking region 752a corresponds to an at least partially transformed region of the optically clear layer 762 and defines the marking 750 visible along the exterior surface of the electronic device. A region of the optically clear layer 762 adjacent the marking region 752a is not transformed, providing a difference in optical properties between the marking region 752a and the adjacent region of optically clear layer 762. In embodiments, this difference in optical properties contributes to a difference in color between the marking region 752a and the adjacent multilayer structure 760 as observed through the cover. As referred to herein, an optically clear layer 762 may include one or more optically clear regions as well as one or more marking regions 752a which are not optically clear.

The color layers 764 and 766 also include one or more colorants. The colorant(s) in the color layers 764 and 766 may be the same or may differ from one another. In some embodiments, the colorant(s) in the color layers 764 and 766 are not sensitive to the wavelength(s) of light produced by the laser.

By the way of example, the optically clear layer 762 may comprise a first colorant which is a transformable colorant. The color layer 764 may comprise a second colorant and the color layer 766 may comprise a third colorant. The second and the third colorants may be the same or may be different.

In aspects described herein, the optical properties of the marking region 752a, the color layers 764 and 766, and the optically dense layer 768 contribute to the visual appearance of the marking 750 as observed through the cover 740. In additional aspects described herein, the optical properties of the color layers 764 and 766 and the optically dense layer 768 contribute to the visual appearance of the multilayer structure 760 adjacent the marking 750 as observed through the cover 740.

Figure 8:
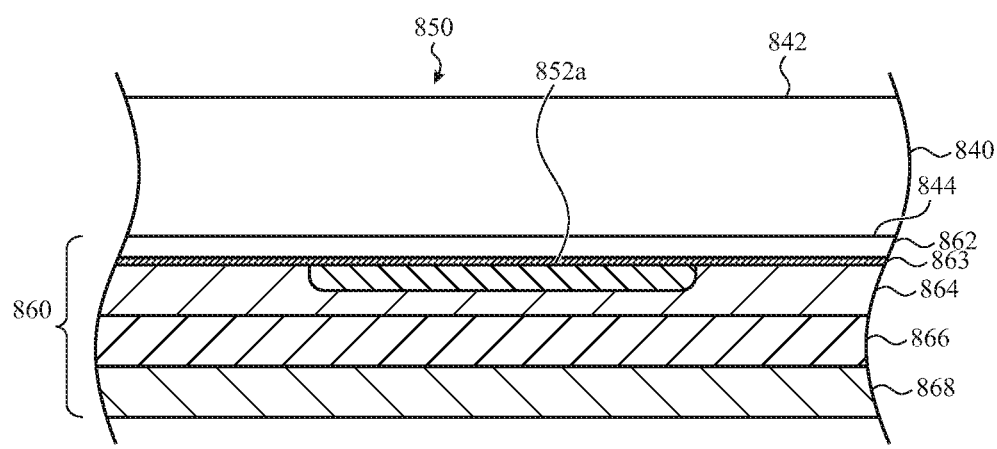
FIG. 8 depicts a cross-sectional view of a marking region formed in a color layer of a multilayer structure and behind a metal layer.

FIG. 8 depicts a cross-sectional view of marking region 852a within a set of layers comprising an optically clear layer 862 and two color layers, 864 and 866. The marking region 852a may at least partially define a marking 850 (typically viewed through a cover 840). The marking 850 may be an example of a portion of the marking 252 of FIG. 2 (with the cross-section taken along line B-B in FIG. 2) or of all or part of any other markings described herein.

In particular, the color layer 864 comprises a transformable colorant and the marking region 852a is formed in the color layer 864. The multilayer structure 860 further comprises a metal layer 863 and an optically dense layer 868.

As previously described, the multilayer structure 860 is disposed along the interior surface 844 of the cover 840. As depicted in FIG. 8, the optically clear layer 862 is disposed along the cover 840, the metal layer 863 is disposed along the optically clear layer 862, the color layer 864 is disposed along the metal layer 863, the color layer 866 is disposed along the color layer 864, and the optically dense layer 868 is disposed along the color layer 866. The exterior surface 842 of the cover 840 is generally opposite the interior surface 844 as depicted in FIG. 8.

The color layer 864 comprises a transformable colorant as previously described. The marking region 852a corresponds to an at least partially transformed region of the color layer 864 and defines the marking 850 visible along the exterior surface of the electronic device. A region of the color layer 864 adjacent the marking region 852a is not transformed, providing a difference in optical properties between the marking region 852a and the adjacent region of color layer 864. In embodiments, the difference in optical properties contributes to a difference in color between the marking 850 and the adjacent multilayer structure 860 observed through the cover 840. In additional aspects of the disclosure, the color layer 864 may include one or more colorants in addition to the transformable colorant.

The color layer 866 also includes one or more colorants. In embodiments, the colorant(s) in the color layer 866 produce a similar visual effect to the colorant(s) in the color layer 864 prior to laser marking. In other words, the color layer 864 may be color matched to the color layer 866 (and vice versa). In some embodiments, the colorant in the color layer 866 is not sensitive to the wavelength(s) of light produced by the laser.

By the way of example, the color layer 864 may include a first colorant and a second colorant which is a transformable colorant. The color layer 866 may include a third colorant. The first and the third colorants may be the same or may be different.

The metal layer 863 has a thickness configured to allow transmission of visible light. Such a metal layer may give a metallic effect to the multilayer structure as seen through the cover. The metal layer 863 may be as previously described with respect to FIG. 4.

When the metal layer 863 is present, the optically clear layer 862 may be included between the transparent cover 840 and the metal layer 863. If a crack is introduced into the metal layer 863, the optically clear layer 862 may limit or prevent propagation of the crack into the cover 840. The optically clear layer 862 may be as previously described with respect to FIG. 4.

In aspects described herein, the optical properties of the marking region 852a, the color layer 866, and the optically dense layer 868 contribute to the visual appearance of the marking 850 as observed through the cover 840. If the marking region 852a does not extend through the thickness of the color layer 864, the optical properties of the color layer 864 may also contribute to the visual appearance of the marking 850. In additional aspects described herein, the optical properties of the color layers 864 and 866 and the optically dense layer 868 contribute to the visual appearance of the multilayer structure 860 adjacent the marking 850 as observed through the cover 840.

Figure 9:
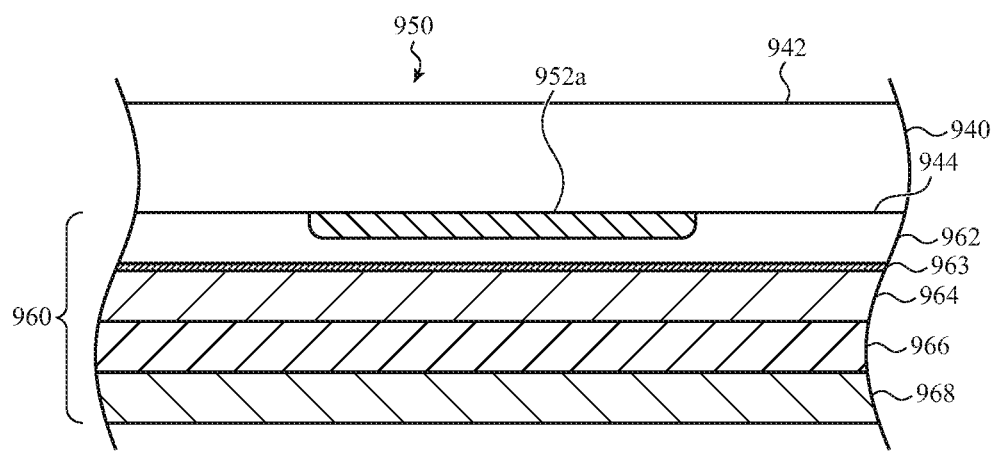
FIG. 9 depicts a cross-sectional view of a marking region formed in an optically clear layer of a multilayer structure and in front of a metal layer.

FIG. 9 depicts a cross-sectional view of a marking region 952a within a set of layers comprising an optically clear layer 962 and two color layers, 964 and 966. The marking region 952a may at least partially define a marking 950 (typically viewed through a cover 940). The marking 950 may be an example of a portion of the marking 252 of FIG. 2 (with the cross-section taken along line B-B in FIG. 2) or of all or part of any other markings described herein.

As depicted in FIG. 9, the optically clear layer 962 comprises a transformable colorant and the marking region 952a is formed in the optically clear layer 962. The multilayer structure 960 further comprises a metal layer 963 and an optically dense layer 968.

As depicted in FIG. 9, the optically clear layer 962 is disposed along the cover 940, the metal layer 963 is disposed along the optically clear layer 962, the color layer 964 is disposed along the metal layer 963, the color layer 966 is disposed along the color layer 964, and the optically dense layer 968 is disposed along the color layer 966. The exterior surface 942 of the cover 940 is generally opposite the interior surface 944 as depicted in FIG. 9.

The optically clear layer 962 comprises a transformable colorant. In the embodiment shown in FIG. 9, the first form of the transformable colorant appears colorless. For example, the optically clear layer 962 prior to laser marking has a relatively high transmittance (e.g., at least 80%, or at least 85%) and does not appear to selectively absorb some wavelengths of visible light. The second form of the transformable colorant does not appear to be colorless. For example, the second form of the transformable colorant may selectively absorb some wavelengths of visible light. Therefore, the marking region 952a has reduced optical clarity as compared to an adjacent region of the optically clear layer 962.

The marking region 952a corresponds to an at least partially transformed region of the optically clear layer 962 and defines the marking 950 visible along the exterior surface of the electronic device. A region of the optically clear layer 962 adjacent the marking region 952a is not transformed, providing a difference in optical properties between the marking region 952a and the adjacent region of the optically clear layer 962. In embodiments, this difference in optical properties contributes to a difference in color between the marking 950 and the adjacent multilayer structure 960 as observed through the transparent cover 940.

The color layers 964 and 966 also include one or more colorants. In embodiments, the colorant(s) in the color layer 966 produce a similar visual effect to the colorant(s) in the color layer 964 prior to laser marking. In other words, the color layer 964 may be color matched to the color layer 966 (and vice versa). In some embodiments, the colorant in the color layers 964 and 966 is not sensitive to the wavelength(s) of light produced by the laser.

By the way of example, the optically clear layer 962 may comprise a first colorant which is a transformable colorant. The color layer 964 may comprise a second colorant and the color layer 966 may comprise a third colorant. The second and the third colorants may be the same or may be different.

The metal layer 963 has a thickness configured to allow transmission of visible light. Such a metal layer may give a metallic effect to the multilayer structure as seen through the cover. When the metal layer 963 is present, an optically clear layer 962 may be included between the transparent cover 940 and the metal layer 963. If a crack is introduced into the metal layer 963, the optically clear layer 962 may limit or prevent propagation of the crack into the transparent cover 940. The metal layer 963 and the optically clear layer 962 may be as previously described with respect to FIG. 4.

In aspects described herein, the optical properties of the marking region 952a, the metal layer 963, the color layers 964 and 966, and the optically dense layer 968 contribute to the visual appearance of the marking 950 as observed through the cover 940. In additional aspects described herein, the optical properties of the metal layer 963, the color layers 964 and 966, and the optically dense layer 968 contribute to the visual appearance of the multilayer structure adjacent the marking 950 as observed through the cover 940.

FIG. 10 depicts a cross-sectional view of marking regions 1052*a* and 1052*b* with a set of layers comprising an optically clear layer 1062 and two color layers, 1064 and 1066. The marking regions 1052*a* and 1052*b* may at least partially define a marking 1050 (typically viewed through a cover 1040). The marking 1050 may be an example of a portion of the marking 252 of FIG. 2 (with the cross-section taken along line B-B in FIG. 2) or of all or part of any other markings described herein.

As depicted in FIG. 10, the marking region 1052*a* is formed in the color layer 1066 and the marking region 1052*b* is formed in the color layer 1064. The multilayer structure 1060 further comprises the metal layer 1063, the optically dense layer 1068, and the protective layer 1069.

As previously described, the multilayer structure 1060 is disposed along the interior surface 1044 of the cover 1040. As depicted in FIG. 10, the optically clear layer 1062 is disposed along the cover 1040, the metal layer 1063 is disposed along the optically clear layer 1062, the color layer 1064 is disposed along the metal layer 1063, the color layer 1066 is disposed along the color layer 1064, and the optically dense layer 1068 is disposed along the color layer 1064. The exterior surface 1042 of the cover 1040 is generally opposite the interior surface 1044 as depicted in FIG. 10.

The color layer 1064 comprises a transformable colorant as previously described. The marking region 1052*b* corresponds to an at least partially transformed region of the color layer 1064 and partially defines the marking 1050 visible along the exterior surface of the electronic device. A region of the color layer 1064 adjacent the marking region 1052*b* is not transformed, providing a difference in optical properties between the marking region 1052*b* and the adjacent region of the color layer 1064. In embodiments, the difference(s) in optical properties contributes to a difference in color between the marking region 1052*b* and the adjacent multilayer structure 1060 observed through the transparent cover 1040. In additional aspects of the disclosure, the color layer 1064 may include one or more colorants in addition to the transformable colorants(s).

The color layer 1066 also comprises a transformable colorant. The transformable colorant of the color layer 1066 may be the same as that of the color layer 1064 or may be different. The marking region 1052*a* corresponds to an at least partially transformed region of the color layer 1066 and partially defines the marking 1050 visible along the exterior surface of the electronic device. A region of the color layer 1066 adjacent the marking region 1052*a* is not transformed, providing a difference in optical properties between the marking region 1052*a* and the adjacent region of the color layer 1066. In embodiments, the difference(s) in optical properties contributes to a difference in color between the marking region 1052*a* and the adjacent multilayer structure 1060 observed through the transparent cover 1040.

By the way of example, the color layer 1064 may include a first colorant and a second colorant which is a transformable colorant. The color layer 1066 may include a third colorant and a fourth colorant which is a transformable colorant. The first and the third colorants may be the same or may be different. The second colorant and the fourth colorant may be the same or may be different.

The metal layer 1063 has a thickness configured to allow transmission of visible light. Such a metal layer may give a metallic effect to the multilayer structure as seen through the cover. When the metal layer 1063 is present, an optically clear layer 1062 may be included between the transparent cover 1040 and the metal layer 1063. If a crack is introduced into the metal layer 1063, the optically clear layer 1062 may limit or prevent propagation of the crack into the transparent cover 1040. The metal layer 1063 and the optically clear layer 1062 may be as previously described with respect to FIG. 4.

In aspects described herein, the optical properties of the marking region 1052*a*, the metal layer 1063, the color layer 1064, and the optically dense layer 1068 contribute to the visual appearance of the marking 1050 as observed through the cover 1040. In addition, the optical properties of the marking region 1052*b*, the metal layer 1063, the color layer 1066, and the optically dense layer 1068 contribute to the visual appearance of the marking 1050 as observed through the cover 1040. If the marking region 1052*a* and/or 1052*b* does not extend through the thickness of the color layer 1064 and/or 1066, the optical properties of the color layer 1064 and/or 1066 may also contribute to the visual appearance of the marking 1050. In additional aspects described herein, the optical properties of the metal layer 1063, the color layers 1064 and 1066, and the optically dense layer 1068 contribute to the visual appearance of the multilayer structure 1060 adjacent the marking 1050 as observed through the cover 1040.

Figure 11:
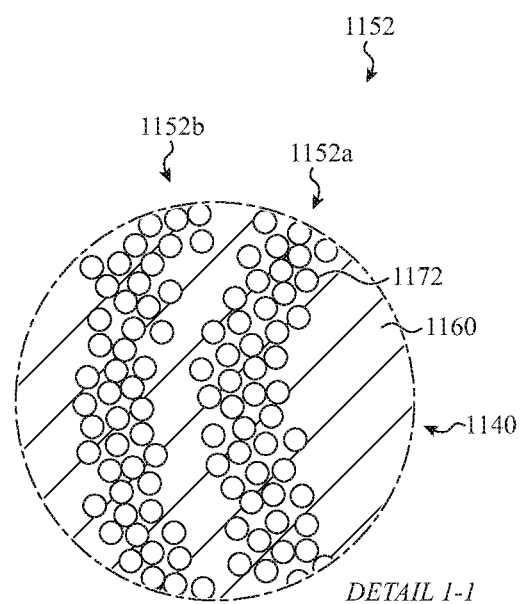
FIG. 11 schematically depicts an enlarged top view of another marking for an electronic device.

FIG. 11 depicts an additional embodiment of an enlarged view of a portion of marking 252 of FIG. 2 (Detail 1-1). The portion of marking 1152 illustrated in FIG. 11 defines two curves 1152*a* and 1152*b*. The curves 1152*a* and 1152*b* are visible through the cover 1140. Each of the curves 1152*a* and 1152*b* are defined by multiple marking elements 1172 formed in a multilayer structure 1160. As previously described, lines and/or shapes in the marking may appear to be continuous rather than formed of discrete marking elements when viewed from a typical viewing distance. However, for the purposes of illustration, FIG. 11 depicts discrete marking elements 1172, some of which are separated from one another and others of which abut one another.

Figure 12:
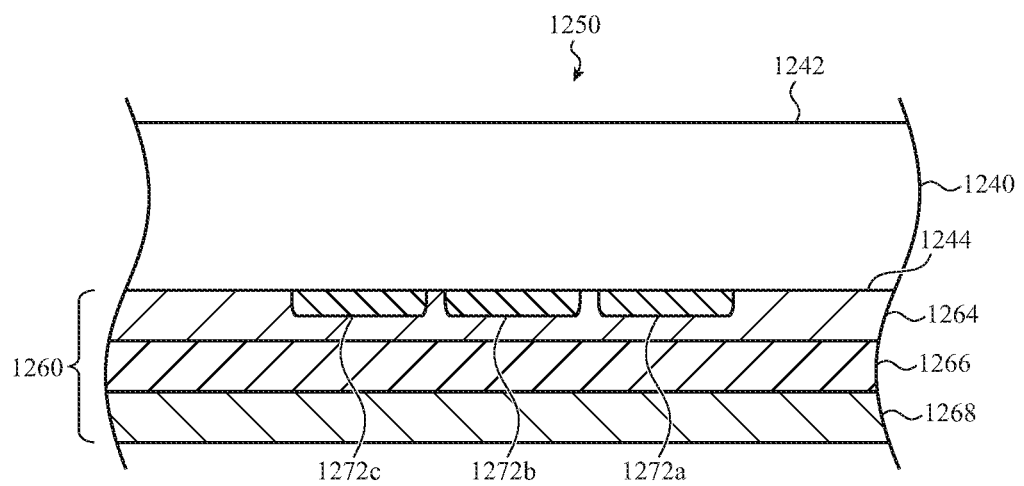
FIG. 12 depicts a cross-sectional view of a marking region formed in a color layer of a multilayer structure.

FIG. 12 schematically depicts a cross-sectional view of discrete marking elements 1272*a*, 1272*b*, and 1272*c* within a set of two color layers, 1264 and 1266. The discrete marking elements 1272*a*, 1272*b*, and 1272*c* may at least partially define a marking 1250 (typically viewed through a cover 1240). The marking 1250 may be an example of a portion of the marking 252 of FIG. 2 (with the cross-section taken along line B-B in FIG. 2) or of all or part of any other markings described herein.

As depicted in FIG. 12, color layer 1264 comprises a transformable colorant and the markings 1272*a*, 1272*b*, and 1272*c* are formed in color layer 1264. Multilayer structure 1260 further comprises an optically dense layer 1268 in addition to the set of color layers.

As previously described, the multilayer structure 1260 is disposed along the interior surface 1244 of the cover 1240. As depicted in FIG. 12, the color layer 1264 is disposed along the cover 1240, the color layer 1266 is disposed along the color layer 1264, and the optically dense layer 1268 is disposed along the color layer 1264. The exterior surface 1242 of the cover 1240 is generally opposite the interior surface 1244 as depicted in FIG. 12.

The marking elements 1272*a*, 1272*b*, and 1272*c* each correspond to an at least partially transformed region of the color layer 1264 and define the marking(s) (e.g., 1250) visible along the exterior surface of the electronic device. A region of the color layer 1264 adjacent the marking elements 1272*a*, 1272*b*, and 1272*c* is not transformed, providing a difference in optical properties between the marking elements 1272*a*, 1272*b*, and 1272*c* (and marking 1250) and the adjacent region of the color layer 1264. In embodiments, the difference(s) in optical properties contribute to a difference in color between the marking elements 1272*a*, 1272*b*, and 1272*c* and the adjacent multilayer structure 1260 observed through the cover 1240. In additional aspects of the disclosure, the color layer 1264 may include one or more colorants in addition to the transformable colorants(s).

In aspects described herein, the optical properties of the marking elements 1272*a*, 1272*b*, and 1272*c*, the color layer 1266, and the optically dense layer 1268 contribute to the visual appearance of the marking elements 1272*a*, 1272*b*, and 1272*c* as observed through the cover 1240. If the marking elements 1272*a*, 1272*b*, and 1272*c* do not extend through the thickness of the color layer 1264, the optical properties of the color layer 1264 may also contribute to the visual appearance of the marking 1250. In additional aspects described herein, the optical properties of the color layers 1264 and 1266 and the optically dense layer 1268 contribute to the visual appearance of the multilayer structure 1260 adjacent the marking 1250 as observed through the cover 1240.

The color layer 1266 also includes one or more colorants. In embodiments, the colorant(s) in the color layer 1266 produce a similar visual effect to the colorant(s) in the color layer 1264 prior to laser marking. In other words, the color layer 1264 may be color matched to the color layer 1266 (and vice versa). In some embodiments, the colorant in the color layer 1266 is not sensitive to the wavelength(s) of light produced by the laser.

By the way of example, the color layer 1264 may include a first colorant and a second colorant which is a transformable colorant. The color layer 1266 may include a third colorant. The first and the third colorants may be the same or may be different.

Figure 13:
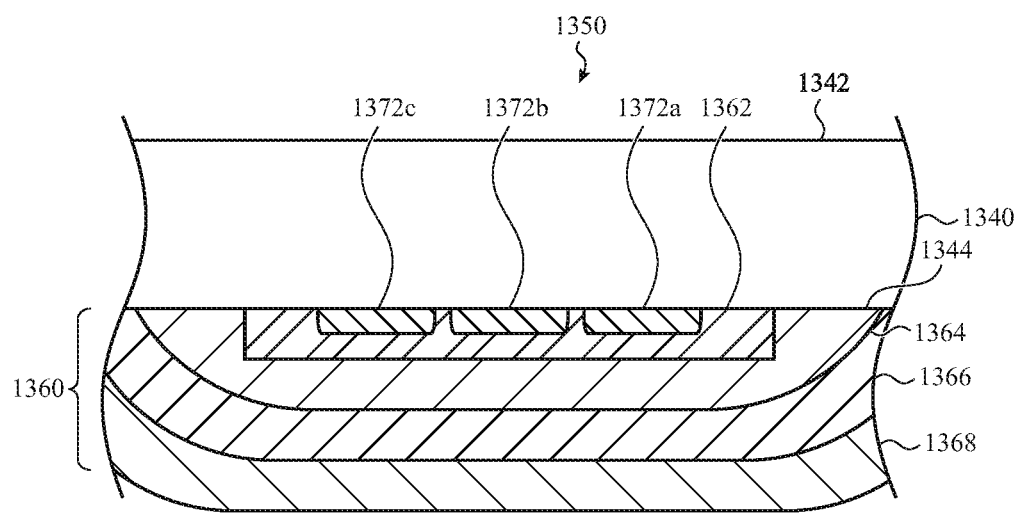
FIG. 13 depicts a cross-sectional view of a marking region formed in a localized color layer of a multilayer structure.

FIG. 13 schematically depicts a cross-sectional view of marking elements 1372*a*, 1372*b*, and 1372*c* within a set of color layers 1362, 1364, and 1366. The marking elements 1372*a*, 1372*b*, and 1372*c* may at least partially define a marking 1350 (typically viewed through a cover 1340). The marking 1350 may be an example of a portion of the marking 252 of FIG. 2 (with the cross-section taken along line B-B in FIG. 2) or of all or part of any other markings described herein.

As depicted in FIG. 13, the marking elements 1372*a*, 1372*b*, and 1372*c* are formed in the color layer 1362. The multilayer structure 1360 further comprises an optically dense layer 1368 in addition to the set of color layers 1362, 1364, and 1366. The color layer 1362 has a lateral dimension less than that of the color layers 1364 and 1366 and therefore may be referred to as a localized layer. The color layer 1364 conforms to the shape of the color layer 1362.

As previously described, the multilayer structure 1360 is disposed along the interior surface 1344 of the cover 1340. As depicted in FIG. 13, the color layer 1362 and a portion of the color layer 1364 are disposed along the cover 1340, another portion of the color layer 1364 is disposed along the color layer 1362, the color layer 1366 is disposed along the color layer 1364, and the optically dense layer 1368 is disposed along the color layer 1366. The exterior surface 1342 of the cover 1340 is generally opposite the interior surface 1344 as depicted in FIG. 13.

The marking elements 1372*a*, 1372*b*, and 1372*c* each correspond to an at least partially transformed region of the color layer 1362 and define the marking(s) (e.g., 1350) visible along the exterior surface of the electronic device. A region of the color layer 1362 adjacent the marking elements 1372*a*, 1372*b*, and 1372*c* is not transformed, providing a difference in optical properties between the marking elements and the adjacent region of the color layer 1362. Further, a similar difference in optical properties may be present between the marking elements and a nearby region of the color layer 1364. In embodiments, the difference(s) in optical properties contributes to a difference in color between the marking 1350 and the adjacent multilayer structure 1360 observed through the cover 1340. In additional aspects of the disclosure, the color layer 1362 may include one or more colorants in addition to the transformable colorants(s).

The color layers 1364 and 1366 also include one or more colorants. In embodiments, the colorant(s) in the color layer 1364 produce a similar visual effect to the colorant(s) in the color layer 1362 prior to laser marking. In other words, the color layer 1364 and/or the color layer 1366 may be color matched to the color layer 1362 (and vice versa). In some embodiments, the colorant in the color layer 1364 is not sensitive to the wavelength(s) of light produced by the laser.

By the way of example, the color layer 1362 may include a first colorant and a second colorant which is a transformable colorant. The color layer 1364 may include a third colorant and the color layer 1366 may include a fourth colorant. The first, the third, and the fourth colorants may all be different or all or some of them may be the same.

In aspects described herein, the optical properties of the marking elements 1372*a*, 1372*b*, and 1372*c*, the color layers 1364 and 1366, and the optically dense layer 1368 contribute to the visual appearance of the marking 1350 as observed through the cover 1340. If the marking elements 1372*a*, 1372*b*, and 1372*c* do not extend through the thickness of the color layer 1362, the optical properties of the color layer 1362 may also contribute to the visual appearance of the marking 1350. In additional aspects described herein, the optical properties of the color layers 1362, 1364, and 1366 and the optically dense layer 1368 contribute to the visual appearance of the multilayer structure 1360 adjacent the marking 1350 as observed through the cover 1340.

Figure 14:
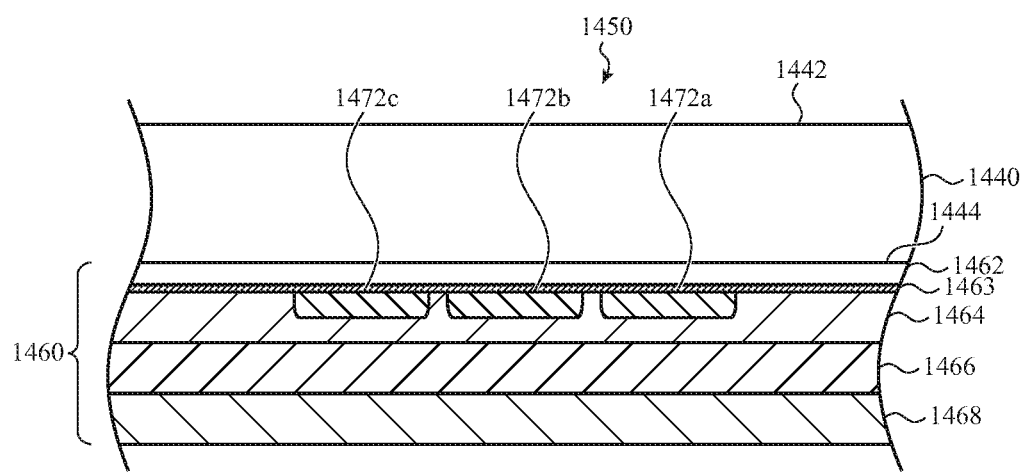
FIG. 14 depicts a cross-sectional view of a marking region formed in a color layer of a multilayer structure and behind a metal layer.

FIG. 14 schematically depicts a cross-sectional view of marking elements 1472*a*, 1472*b*, and 1472*c* within a set of layers comprising an optically clear layer 1462 and two color layers, 1464 and 1466. The marking elements 1472*a*, 1472*b*, and 1472*c* may at least partially define a marking 1450 (typically viewed through a cover 1440). The marking 1450 may be an example of a portion of the marking 252 of FIG. 2 (with the cross-section taken along line B-B in FIG. 2) or of all or part of any other markings described herein.

As depicted in FIG. 14, the color layer 1464 comprises a transformable colorant and the marking elements 1472*a*, 1472*b*, and 1472*c* are formed in the color layer 1464. The multilayer structure 1460 further comprises a metal layer 1463 and an optically dense layer 1468. As previously described, the multilayer structure 1460 is disposed along the interior surface 1444 of the cover 1440. As depicted in FIG. 14, the optically clear layer 1462 is directly disposed along the cover 1440, the metal layer 1463 is disposed along the optically clear layer 1462, the color layer 1464 is disposed along the metal layer 1463, the color layer 1466 is disposed along the color layer 1464, and the optically dense layer 1468 is disposed along the color layer 1466. The exterior surface 1442 of the cover 1440 is generally opposite the interior surface 1444 as depicted in FIG. 14.

The marking elements 1472*a*, 1472*b*, and 1472*c* each correspond to an at least partially transformed region of the color layer 1464 and define the marking(s) visible along the exterior surface of the electronic device. A region of the color layer 1464 adjacent the marking elements 1472*a*, 1472*b*, and 1472*c* is not transformed, providing a difference in optical properties between the marking elements 1472*a*, 1472*b*, and 1472*c* and the adjacent region of the color layer 1464. In embodiments, the difference(s) in optical properties contributes to a difference in color between the marking 1450 and the adjacent multilayer structure 1460 observed through the cover 1440. In additional aspects of the disclosure, the color layer 1464 may include one or more colorants in addition to the transformable colorants(s).

The color layers 1464 and 1466 also include one or more colorants. In embodiments, the colorant(s) in the color layer 1466 produce a similar visual effect to the colorant(s) in the color layer 1464 prior to laser marking. In other words, the color layer 1466 may be color matched to the color layer 1464 (and vice versa). In some embodiments, the colorant in the color layer 1464 is not sensitive to the wavelength(s) of light produced by the laser.

By the way of example, the color layer 1464 may include a first colorant and a second colorant which is a transformable colorant. The color layer 1466 may include a third colorant. The first and the third colorants may be the same or may be different.

The metal layer 1463 has a thickness configured to allow transmission of visible light. Such a metal layer may give a metallic effect to the multilayer structure as seen through the cover. When the metal layer 1463 is present, an optically clear layer 1462 may be included between the cover 1440 and the metal layer 1463. If a crack is introduced into metal layer 1463, the optically clear layer may limit or prevent propagation of the crack into the cover 1440. The metal layer 1463 and the optically clear layer 1462 may be as previously described with respect to FIG. 4.

In aspects described herein, the optical properties of the marking elements 1472*a*, 1472*b*, and 1472*c*, the metal layer 1463, the color layer 1466, and the optically dense layer 1468 contribute to the visual appearance of the marking 1450 as observed through the cover 1440. If the marking elements 1472*a*, 1472*b*, and 1472*c* do not extend through the thickness of the color layer 1464, the optical properties of the color layer 1464 may also contribute to the visual appearance of the marking 1450. In additional aspects described herein, the optical properties of the metal layer 1463, the color layers 1464 and 1466, and the optically dense layer 1468 contribute to the visual appearance of the multilayer structure 1460 adjacent the marking 1450 as observed through the cover 1440.

Figure 15:
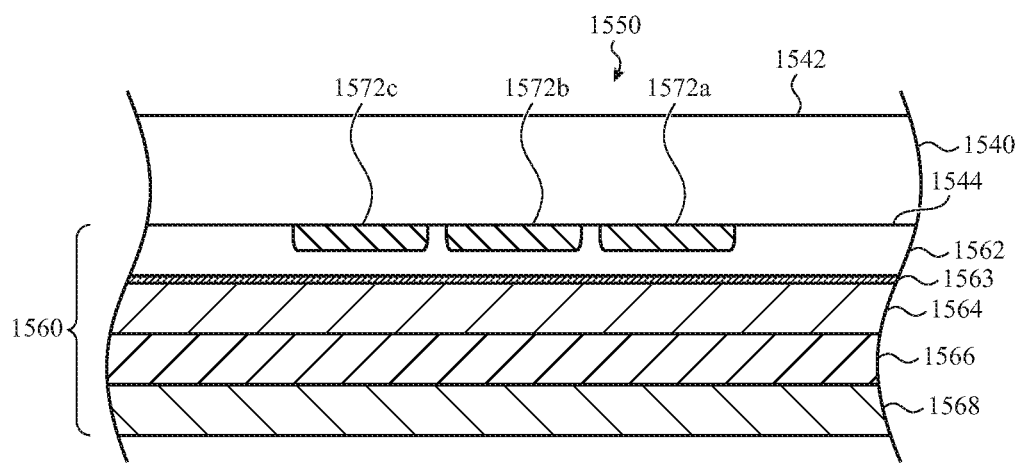
FIG. 15 depicts a cross-sectional view of a marking region formed in an optically clear layer of a multilayer structure and in front of a metal layer.

FIG. 15 depicts a cross-sectional view of marking elements 1572*a*, 1572*b*, and 1572*c* within a set of layers comprising an optically clear layer 1562 and two color layers 1564 and 1546. The marking elements 1572*a*, 1572*b*, and 1572*c* may at least partially define a marking 1550 (typically viewed through a cover 1540). The marking 1550 may be an example of a portion of the marking 252 of FIG. 2 (with the cross-section taken along line B-B in FIG. 2) or of all or part of any other markings described herein.

As depicted in FIG. 15, marking elements 1572*a*, 1572*b*, and 1572*c* are formed in an optically clear layer 1562. The multilayer structure 1560 further comprises a metal layer 1563 and an optically dense layer 1568.

As previously described, a multilayer structure 1560 is disposed along an interior surface 1544 of cover 1540. As depicted in FIG. 15, the optically clear layer 1562 is directly disposed along the cover 1540, the metal layer 1563 is disposed along the optically clear layer 1562, the color layer 1564 is disposed along the metal layer 1563, the color layer 1566 is disposed along the color layer 1564, and the optically dense layer 1568 is disposed along the color layer 1566. The exterior surface 1542 of the cover 1540 is generally opposite the interior surface 1544 as depicted in FIG. 15.

The optically clear layer 1562 comprises a transformable colorant. In the embodiment shown in FIG. 15, the first form of the transformable colorant appears colorless. For example, the optically clear layer 1562 prior to laser marking has a relatively high transmittance (e.g., at least 80%, or at least 85%) and does not appear to selectively absorb some wavelengths of visible light. The second form of the transformable colorant does not appear to be colorless. For example, the second form of the transformable colorant may selectively absorb some wavelengths of visible light. Therefore, the marking elements 1572*a*, 1572*b*, and 1572*c* have reduced optical clarity as compared to an adjacent region of the optically clear layer 1562.

Marking elements 1572*a*, 1572*b*, and 1572*c* each correspond to an at least partially transformed region of the optically clear layer 1562 and define the marking(s) (e.g., 1550) visible along the exterior surface of the electronic device. A region of the optically clear layer 1562 adjacent the marking elements 1572*a*, 1572*b*, and 1572*c* is not transformed, providing a difference in optical properties between the marking elements 1572*a*, 1572*b*, and 1572*c* and the adjacent region of the optically clear layer 1562. In embodiments, this difference in optical properties contributes to a difference in color between the marking 1550 and the adjacent multilayer structure 1560 as observed through the cover.

The color layers 1564 and 1566 also include one or more colorants. In embodiments, the colorant(s) in the color layer 1566 produce a similar visual effect to the colorant(s) in the color layer 1564 prior to laser marking. In other words, the color layer 1564 may be color matched to the color layer 1566 (and vice versa). In some embodiments, the colorant in the color layers 1564 and 1566 is not sensitive to the wavelength(s) of light produced by the laser.

By the way of example, the optically clear layer 1562 may comprise a first colorant which is a transformable colorant. The color layer 1564 may comprise a second colorant and the color layer 1566 may comprise a third colorant. The second and the third colorants may be the same or may be different.

The metal layer 1563 has a thickness configured to allow transmission of visible light. Such a metal layer may give a metallic effect to the multilayer structure as seen through the cover. When the metal layer 1563 is present, an optically clear layer 1562 may be included between the cover 1540 and the metal layer 1563. If a crack is introduced into the metal layer 1563, an optically clear layer may limit or prevent propagation of the crack into the cover 1540. The metal layer 1563 and the optically clear layer 1562 may be as previously described with respect to FIG. 4.

In aspects described herein, the optical properties of the marking elements 1572*a*, 1572*b*, and 1572*c*, the metal layer 1563, the color layers 1564 and 1566, and the optically dense layer 1568 contribute to the visual appearance of the marking 1550 as observed through the cover. In additional aspects described herein, the optical properties of the metal layer 1563, the color layers 1564 and 1566, and the optically dense layer 1568 contribute to the visual appearance of the multilayer structure 1560 adjacent the marking 1550 as observed through the cover 1540.

Additional aspects of the disclosure relate to laser-based processes for marking electronic devices. In embodiments, the electronic device comprises a multilayer structure disposed along an interior surface of a cover. In further embodiments, at least one layer of the multilayer structure comprises a colorant which transforms upon exposure to light from a laser, thereby producing a marking region in the layer. In embodiments, the colorant is not substantially transformable upon exposure to ambient light over a typical lifetime of the electronic device. The marking region defines the marking visible along the exterior surface of the electronic device.

In embodiments, the laser produces a pulsed laser beam which is directed towards the multilayer structure through the cover. In embodiments, the laser is focused through the cover onto the layer comprising the colorant to be transformed. Exposing the colorant to a pulse of the focused laser beam transforms the colorant from a first form to a second form in a localized region of the layer, thereby forming a marking element in the localized region. In embodiments, any effect of the pulse of the focused laser beam outside this localized region is not visually observable through the cover. The amount of transformation from the first form to the second form of the colorant in the localized region of the layer depends, in part, on the extent of the exposure of the colorant to pulse(s) of the laser beam.

In embodiments, exposure of the layer to a single pulse of the laser beam produces a marking element in the layer in which at least some of the colorant has transformed to the second form in a localized region of the layer. In embodiments, the laser is operated so that adjacent marking elements overlap or overlay one another. For example, the adjacent marking elements may overlap so that individual marking elements are not distinguishable. In additional embodiments, the laser is operated so that adjacent marking elements are separated from one another or abut, but do not substantially overlap, one another (as schematically illustrated in FIG. 11). Further, a given marking region may include different amounts of overlap between marking elements.

The spot size of the laser may substantially determine the width and/or shape of the marking elements. The marking elements may have shapes that are generally circular, elliptical, rectangular, square, or combinations thereof. Further the marking elements may have shapes formed by overlapping of circles, ellipses, rectangles, squares, or combinations thereof.

In embodiments, the laser may be operated in raster mode, in vector mode, or a combination thereof. In embodiments, the laser may produce a wavelength in the near infrared range (e.g., from about 700 nm to about 1500 nm). The average laser power may be from about 1 W to about 20 W. The spot size may be from about 10 µm to about 50 µm. In some embodiments, the laser may be operated in burst mode, with each burst including multiple pulses. In some embodiments, the laser is a femtosecond laser producing pulses having an effective pulse duration in the femtosecond range.

By the way of example, a process of forming a marking in a multilayer structure may include focusing a laser beam within a layer of the multilayer structure comprising a colorant in a first form. The process may further include moving the laser beam to transform at least some of the colorant to a second form within a marking region. As viewed through the cover, the multilayer structure in the marking region may have a first color prior to the marking process and a second color different than and visually distinct from the first color after the marking process. The multilayer structure adjacent the marking may retain the first color. In additional embodiments, the multilayer structure is not substantially ablated by the laser marking process. In embodiments, marking regions may be sequentially formed in different layers of the multilayer structure by forming a first marking region in a first layer, adjusting the focus of the laser beam, and then forming a second marking region in a second layer different from the first layer.

Figure 16:
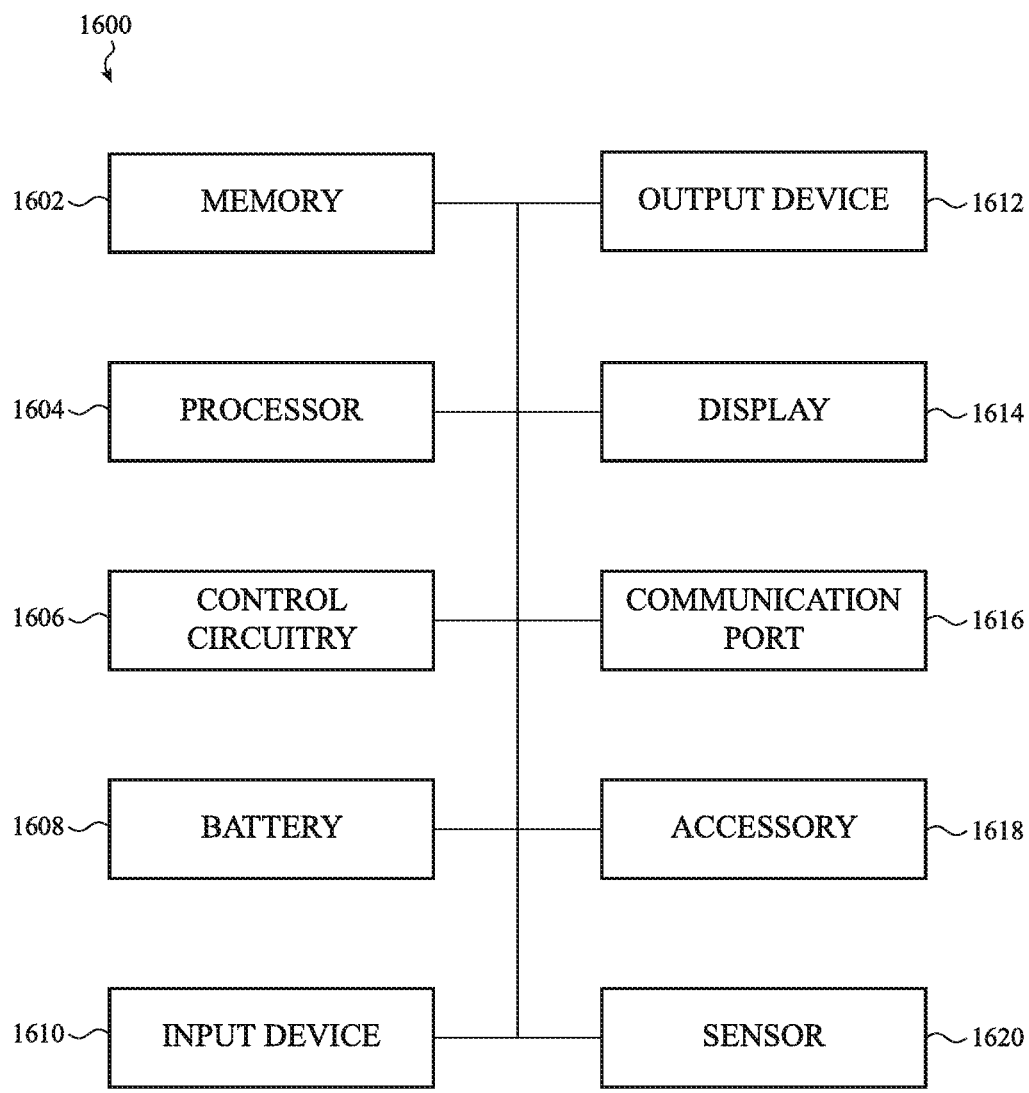
FIG. 16 depicts a block diagram of example components of an example electronic device.

FIG. 16 is a block diagram of example components of an example electronic device. The schematic representation depicted in FIG. 16 may correspond to components of the devices depicted in FIGS. 1A-15, described above. However, FIG. 16 may also more generally represent other types of electronic devices including a laser marking.

The electronic device 1600 also includes a processor 1604 operably connected with a computer-readable memory 1602. The processor 1604 may be operatively connected to the memory 1602 component via an electronic bus or bridge. The processor 1604 may be implemented as one or more computer processors or microcontrollers configured to perform operations in response to computer-readable instructions. The processor 1604 may include a central processing unit (CPU) of the device 1600. Additionally and/or alternatively, the processor 1604 may include other electronic circuitry within the device 1600 including application specific integrated chips (ASIC) and other microcontroller devices. The processor 1604 may be configured to perform functionality described in the examples above.

The memory 1602 may include a variety of types of non-transitory computer-readable storage media, including, for example, read access memory (RAM), read-only memory (ROM), erasable programmable memory (e.g., EPROM and EEPROM), or flash memory. The memory 1602 is configured to store computer-readable instructions, sensor values, and other persistent software elements.

The electronic device 1600 may include control circuitry 1606. The control circuitry 1606 may be implemented in a single control unit and not necessarily as distinct electrical circuit elements. As used herein, "control unit" will be used synonymously with "control circuitry." The control circuitry 1606 may receive signals from the processor 1604 or from other elements of the electronic device 1600.

As shown in FIG. 16, the electronic device 1600 includes a battery 1608 that is configured to provide electrical power to the components of the electronic device 1600. The battery 1608 may include one or more power storage cells that are linked together to provide an internal supply of electrical power. The battery 1608 may be operatively coupled to power management circuitry that is configured to provide appropriate voltage and power levels for individual components or groups of components within the electronic device 1600. The battery 1608, via power management circuitry, may be configured to receive power from an external source, such as an alternating current power outlet. The battery 1608 may store received power so that the electronic device 1600 may operate without connection to an external power source for an extended period of time, which may range from several hours to several days.

In some embodiments, the electronic device 1600 includes one or more input devices 1610. The input device 1610 is a device that is configured to receive input from a user or the environment. The input device 1610 may include, for example, a push button, a touch-activated button, a touch screen (e.g., a touch-sensitive display or a force-sensitive display), capacitive touch button, dial, crown, or the like. In some embodiments, the input device 1610 may provide a dedicated or primary function, including, for example, a power button, volume buttons, home buttons, scroll wheels, and camera buttons.

In embodiments, an electronic device 1600 may include one or more sensors 1620. For example, the sensors 1620 may be a force sensor, a capacitive sensor, an accelerometer, a barometer, a gyroscope, a magnetometer, a proximity sensor, a light sensor, or the like. The sensors 1620 may be operably coupled to processing circuitry. In some embodiments, the sensors 1620 may detect deformation and/or changes in configuration of the electronic device and be operably coupled to processing circuitry which controls the display based on the sensor signals. In addition, the sensors 1620 may include a microphone, acoustic sensor, light sensor, optical facial recognition sensor, or other types of sensing device.

In some embodiments, the electronic device 1600 includes one or more output devices 1612 configured to provide output to a user. The output device 1612 may include a display 1614 that renders visual information generated by the processor 1604. The output device 1612 may also include one or more speakers to provide audio output.

The display 1614 may include a liquid-crystal display (LCD), light-emitting diode (LED) display, organic light-emitting diode (OLED) display, an active layer organic light emitting diode (AMOLED) display, organic electroluminescent (EL) display, electrophoretic ink display, or the like. If the display 1614 is a liquid-crystal display or an electrophoretic ink display, the display may also include a backlight component that can be controlled to provide variable levels of display brightness. If the display 1614 is an organic light-emitting diode or organic electroluminescent type display, the brightness of the display 1614 may be controlled by modifying the electrical signals that are provided to display elements. In addition, information regarding configuration and/or orientation of the electronic device 1600 may be used to control the output of the display 1614 as described with respect to input devices 1610.

The electronic device 1600 may also include a communication port 1616 that is configured to transmit and/or receive signals or electrical communication from an external or separate device. The communication port 1616 may be configured to couple to an external device via a cable, adaptor, or other type of electrical connector. In some embodiments, the communication port 1616 may be used to couple the electronic device 1600 to a host computer.

The electronic device 1600 may also include at least one accessory 1618, such as a camera, a flash for the camera, or other such device. The camera may be connected to other parts of the electronic device 1600 such as the control circuitry.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
   an enclosure component;
   a display positioned at least partially within the enclosure component;
   a transparent cover attached to the enclosure component and having an interior surface and an exterior surface, the exterior surface defining a portion of an exterior surface of the electronic device; and
   a multilayer structure disposed along at least a portion of the interior surface and comprising:
   an optically dense layer; and
   a set of color layers positioned between the optically dense layer and the interior surface, the set of color layers comprising:
   a first color layer along the interior surface and comprising:
   a first form of a first colorant having first optical properties; and
   a second form of the first colorant defining a marking visible along the exterior surface of the electronic device, the second form transformed from the first form using a laser-based process to have second optical properties different than the first optical properties, the second optical properties including a characteristic hue; and
   a second color layer comprising a second colorant different from the first colorant, at least a portion of the second color layer positioned between the first color layer and the optically dense layer.

2. The electronic device of claim 1, wherein:
   the first color layer extends along a first portion of the interior surface of the transparent cover;
   the portion of the second color layer positioned between the first color layer and the optically dense layer is a first portion of the second color layer; and
   a second portion of the second color layer extends along a second portion of the interior surface.

3. The electronic device of claim 1, wherein the second color layer further comprises a third colorant other than the second colorant.

4. The electronic device of claim 1, wherein:
   the characteristic hue of the second form of the first colorant is a second characteristic hue; and
   the first form of the first colorant has a first characteristic hue different than the second characteristic hue.

5. The electronic device of claim 1, wherein the first form of the first colorant appears colorless.

6. The electronic device of claim 1, wherein:
   the optically dense layer has an achromatic characteristic color; and
   the optically dense layer is free of artifacts from the laser-based process.

7. The electronic device of claim 1, wherein:
   the transparent cover comprises a transparent glass sheet having a thickness of less than 1 mm; and
   the transparent glass sheet is chemically strengthened.

8. An electronic device comprising:
   a display; and an enclosure at least partially surrounding the display, the enclosure comprising:
- an enclosure component defining at least a portion of a side exterior surface of the electronic device;
- a transparent cover attached to the enclosure component and defining at least a portion of a rear exterior surface of the electronic device; and
- a multilayer structure disposed along at least a portion of an interior surface of the transparent cover and comprising:
  - an optically clear layer disposed along the at least the portion of the interior surface;
  - an optically dense layer;
  - a metal layer positioned between the optically clear layer and the optically dense layer, the metal layer configured to at least partially transmit visible light and having a thickness less than 10 nm;
  - a first color layer positioned between the metal layer and the optically dense layer, the first color layer comprising a first colorant;
  - a second color layer positioned between the first color layer and the optically dense layer, the second color layer comprising a second colorant;
  - a first form of a laser-reactive colorant dispersed within at least one of the first or second color layers; and
  - a second form of the laser-reactive colorant dispersed within the at least one of the first or second color layers and defining a marking visible along the rear exterior surface.

9. The electronic device of claim 8, wherein the laser-reactive colorant transforms from the first form to the second form upon exposure to a laser beam comprising near infrared light.

10. The electronic device of claim 8, wherein the laser-reactive colorant comprises an irreversible thermochromic material.

11. The electronic device of claim 8, wherein:
the laser-reactive colorant comprises a dye or a pigment; and
the marking has a minimum feature width of 50 microns.

12. The electronic device of claim 8, wherein the first color layer and the second color layer each has a thickness from 2 microns to 10 microns.

13. The electronic device of claim 8, wherein the optically clear layer has a thickness from 1 micron to 5 microns.

14. The electronic device of claim 8, wherein the metal layer comprises aluminum.

15. The electronic device of claim 8, wherein the optically dense layer has an optical density of 1 or more.

16. An enclosure for an electronic device, the enclosure comprising:
- an enclosure component at least partially defining an interior volume for receiving electronic components;
- a transparent cover attached to the enclosure component and having an interior surface and an exterior surface, the exterior surface defining a portion of an exterior surface of the electronic device; and
- a multilayer structure disposed along at least a portion of the interior surface and comprising:
  - an optically dense layer; and
  - a set of layers positioned between the optically dense layer and the interior surface and comprising a first color layer between the interior surface and a second color layer, at least one of the first color layer or the second color layer having:
    - a first region comprising a first form of a color-changing colorant; and
    - a second region defining a marking visible along the exterior surface and comprising a second form of the color-changing colorant, the second form of the color-changing colorant having a characteristic hue.

17. The enclosure of claim 16, wherein each of the first region and the second region further comprises a colorant other than the color-changing colorant.

18. The enclosure of claim 16, wherein:
the second region is formed in the first color layer and the second color layer.

19. The enclosure of claim 16, wherein
the set of layers further includes:
an optically clear layer positioned along the interior surface; and
a metal layer positioned between the optically clear layer and the first color layer.

20. The enclosure of claim 19, wherein the optically clear layer is a polymeric layer.

* * * * *